United States Patent [19]

Komori et al.

[11] Patent Number: 5,602,048

[45] Date of Patent: *Feb. 11, 1997

[54] SEMICONDUCTOR INTEGRATED CIRCUIT DEVICE AND METHOD OF MANUFACTURING THE SAME

[75] Inventors: Kazuhiro Komori, Higashikurume; Satoshi Meguro, Hionde-machi; Toshiaki Nishimoto, Tama; Hitoshi Kume, Musashino; Hideaki Yamamoto, Tokorozawa, all of Japan

[73] Assignee: Hitachi, Ltd., Tokyo, Japan

[*] Notice: The term of this patent shall not extend beyond the expiration date of Pat. No. 5,445,980.

[21] Appl. No.: 443,036

[22] Filed: May 17, 1995

Related U.S. Application Data

[63] Continuation of Ser. No. 147,037, Nov. 4, 1993, Pat. No. 5,445,980, which is a continuation of Ser. No. 914,542, Jul. 16, 1992, abandoned, which is a division of Ser. No. 794,648, Nov. 18, 1991, Pat. No. 5,153,144, which is a continuation of Ser. No. 349,221, May 8, 1989, abandoned.

[30] Foreign Application Priority Data

| May 10, 1988 | [JP] | Japan | 63-114420 |
| Jun. 20, 1988 | [JP] | Japan | 63-152747 |

[51] Int. Cl.$^6$ .................................................. H01L 21/8247
[52] U.S. Cl. ........................... 437/43; 437/44; 437/52
[58] Field of Search .................................... 437/43, 44, 52

[56] References Cited

U.S. PATENT DOCUMENTS

| 4,698,787 | 10/1987 | Mulcherjee | 365/185 |
| 5,153,144 | 10/1992 | Komori et al. | 437/52 |
| 5,445,980 | 2/1995 | Komori et al. | 437/52 |

Primary Examiner—Tom Thomas
Attorney, Agent, or Firm—Antonelli, Terry, Stout & Kraus, LLP

[57] ABSTRACT

An EEPROM (Electrically Erasable Programmable Read Only Memory) has a structure in which the corners of a floating gate electrode of each memory cell MISFET near the source region thereof are rounded.

The EEPROM is manufactured by a method characterized in that the ions of an impurity at a high dose are implanted in self-alignment with the floating gate electrode and control gate electrode of the memory cell MISFET so as to form the source and drain regions thereof, whereupon an oxidizing treatment is carried out.

11 Claims, 18 Drawing Sheets

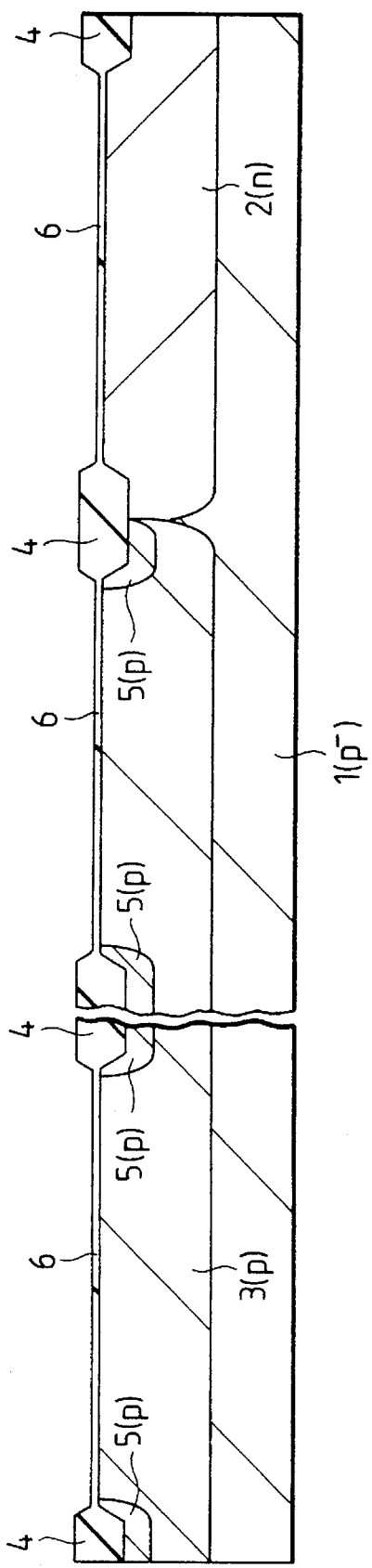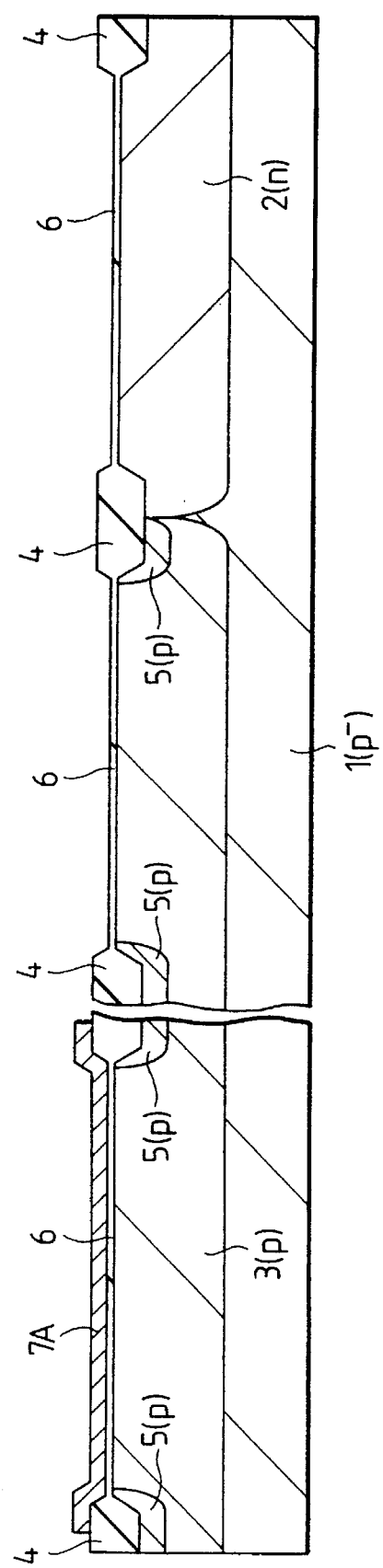

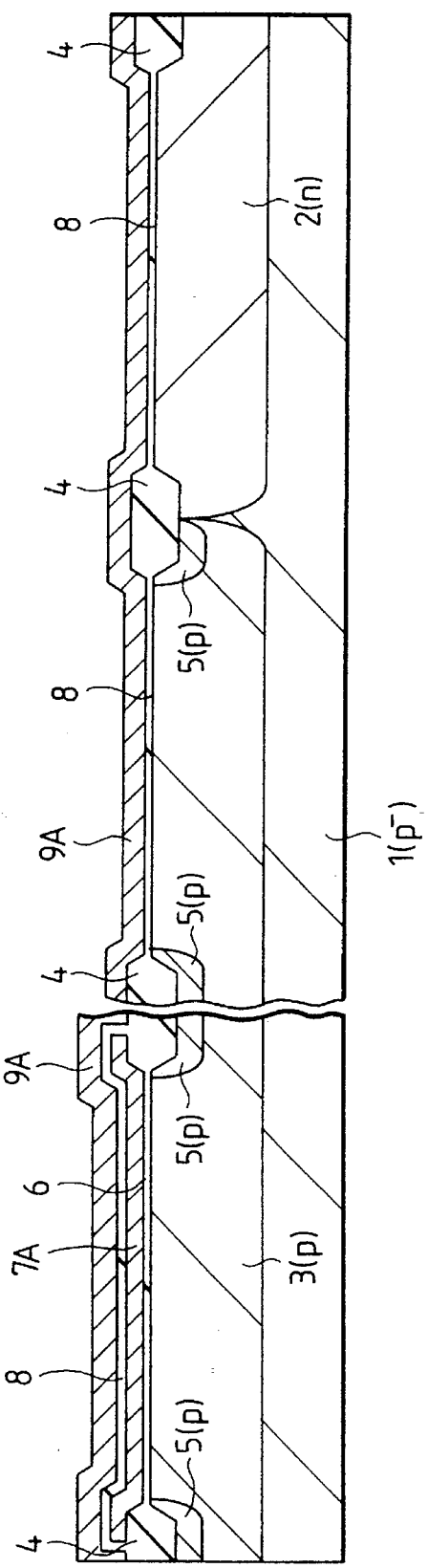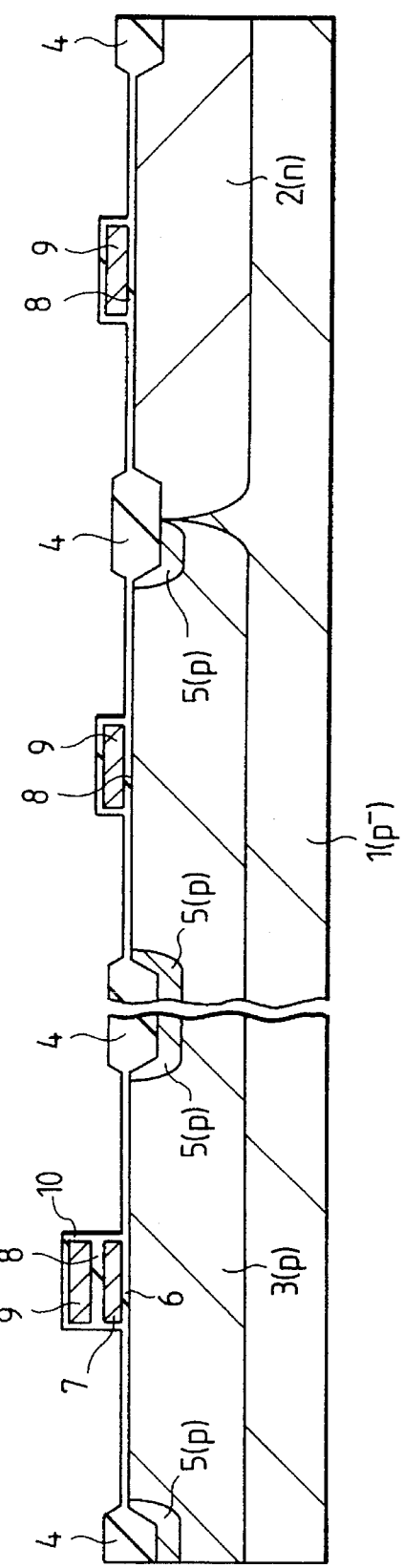

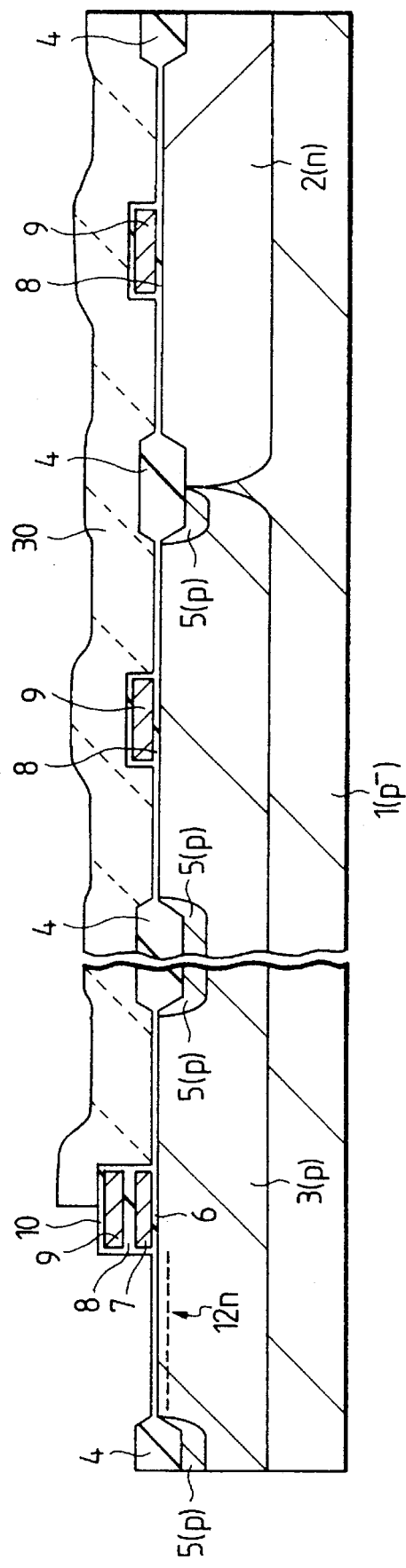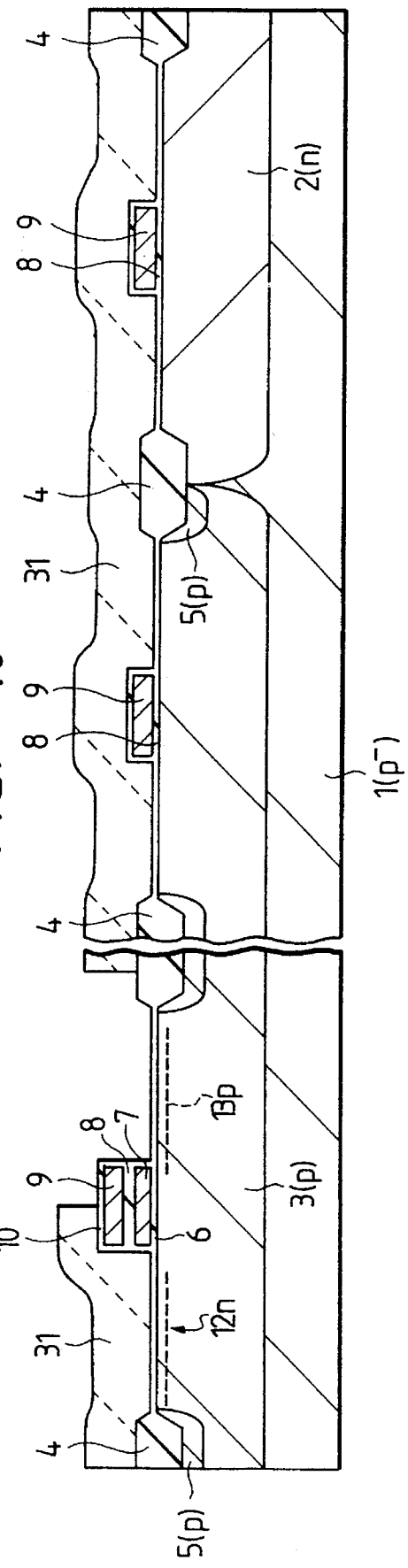

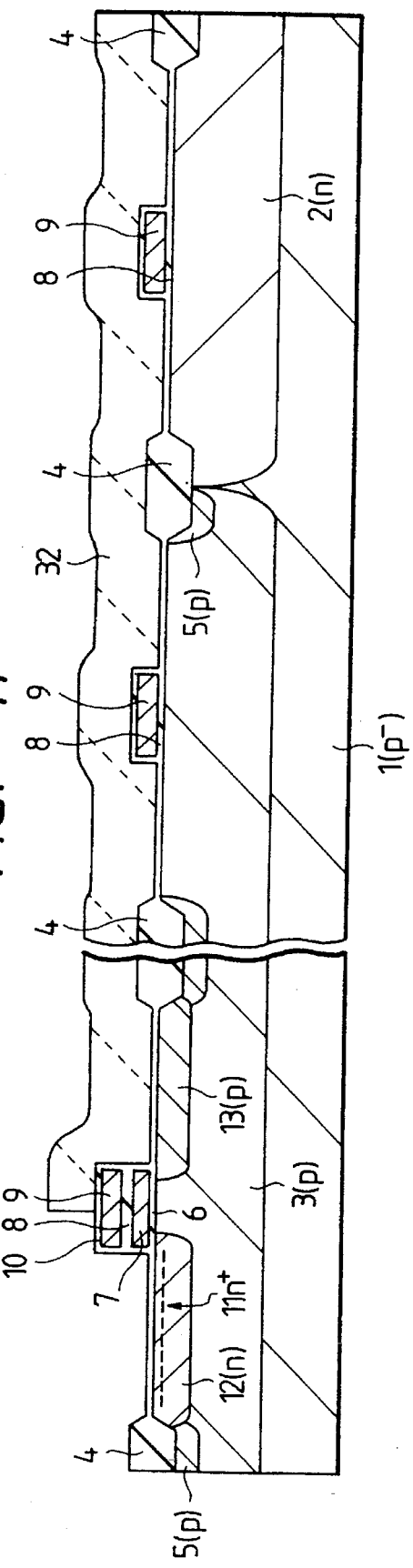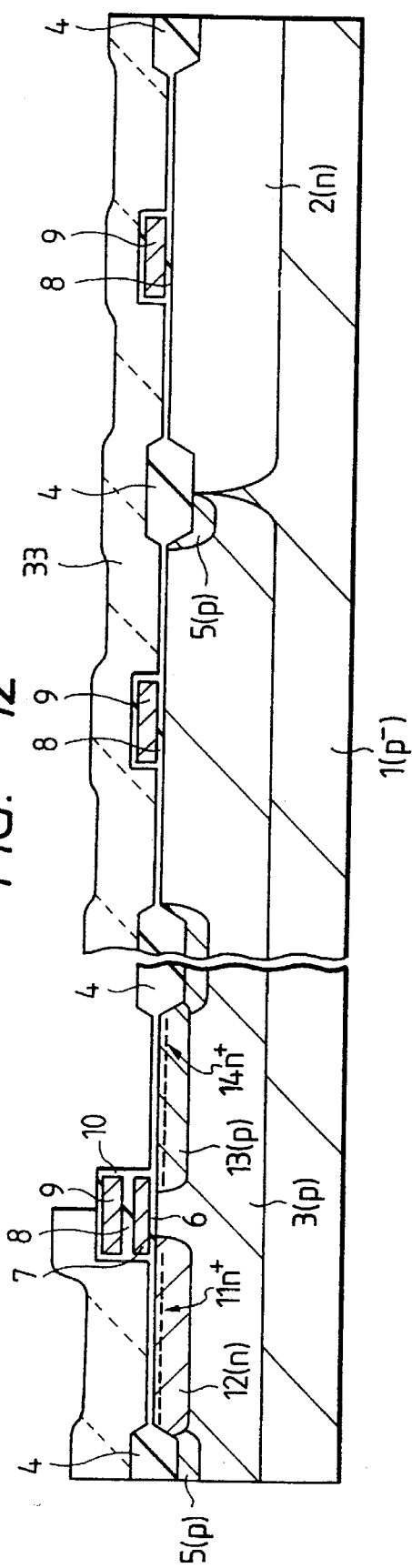

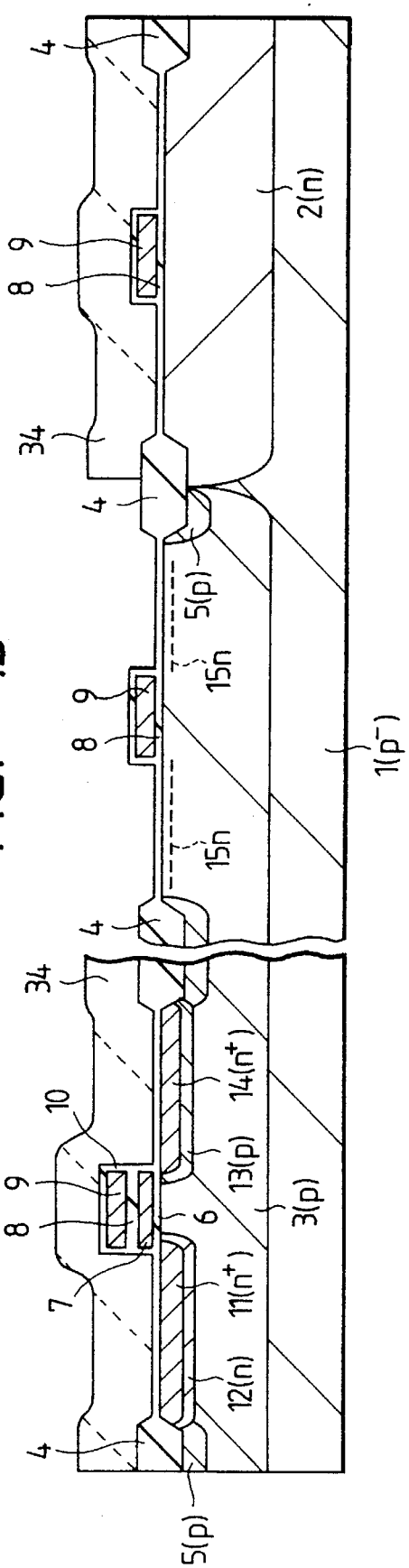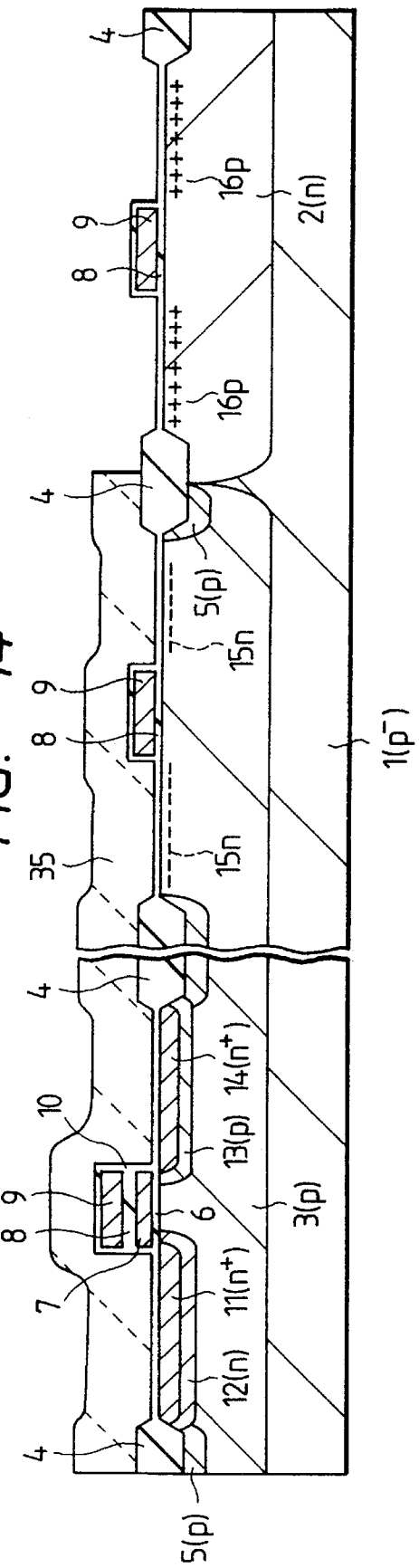

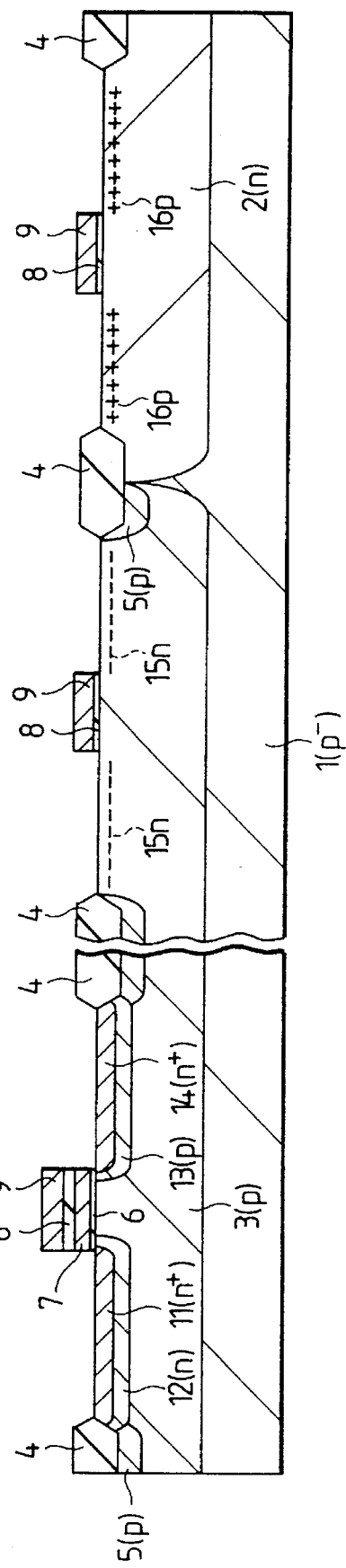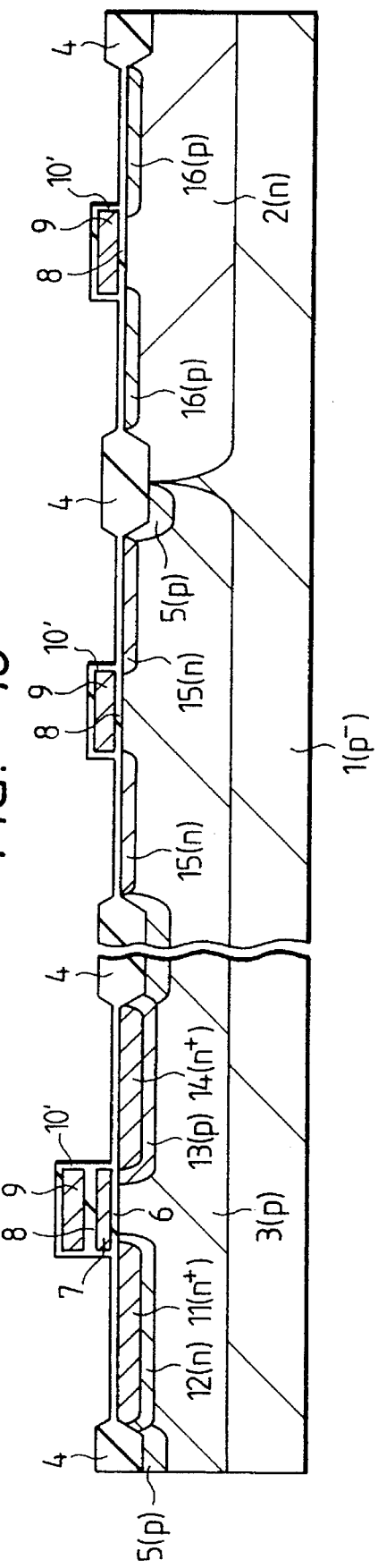

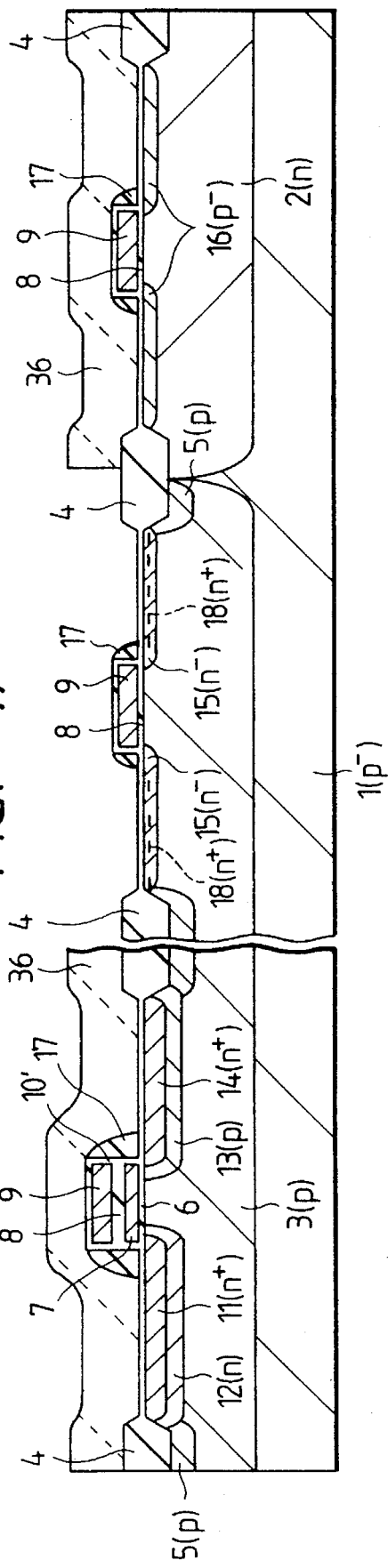
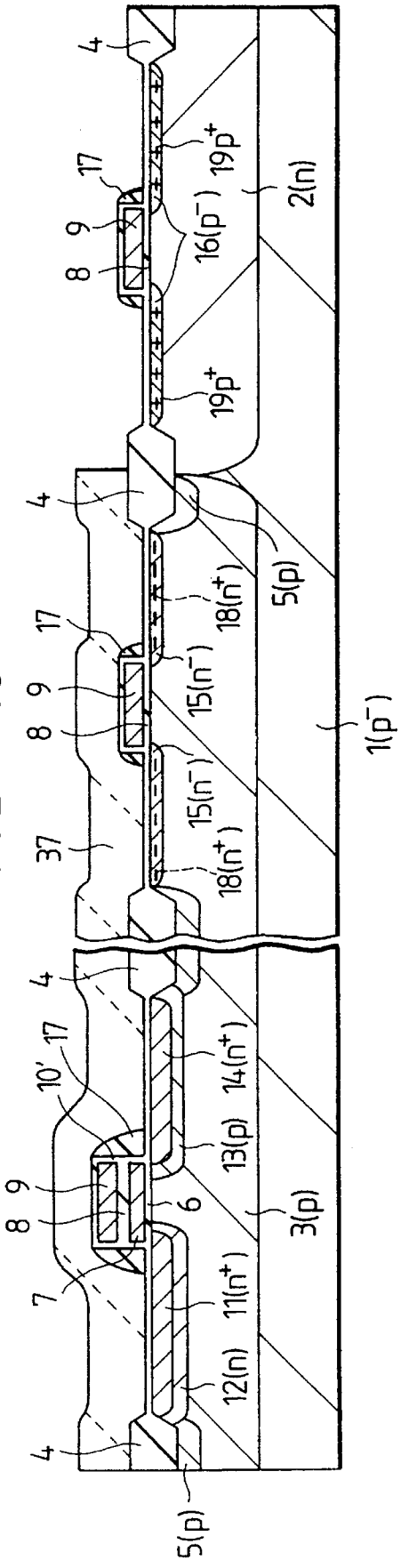
FIG. 17
FIG. 18

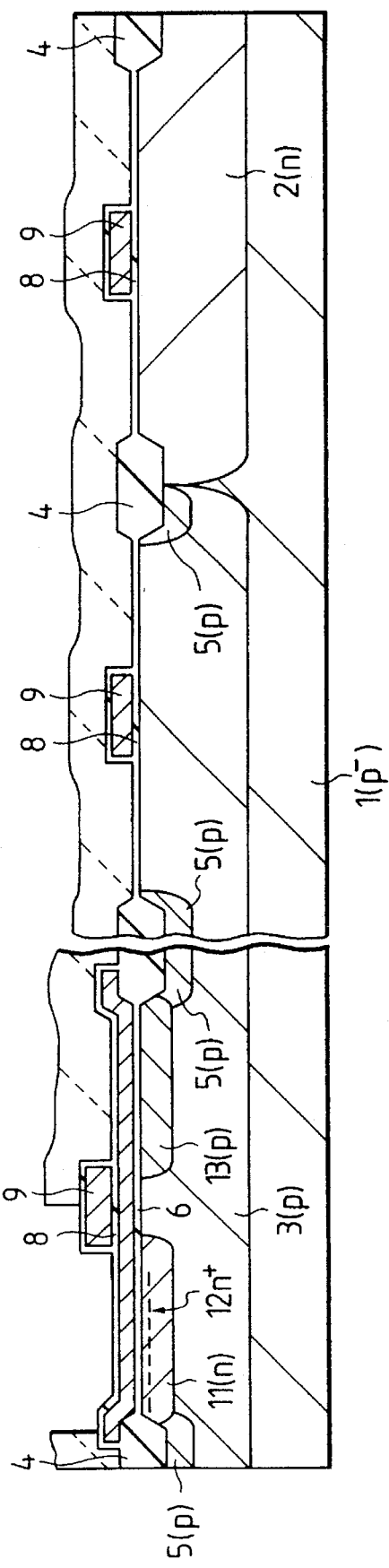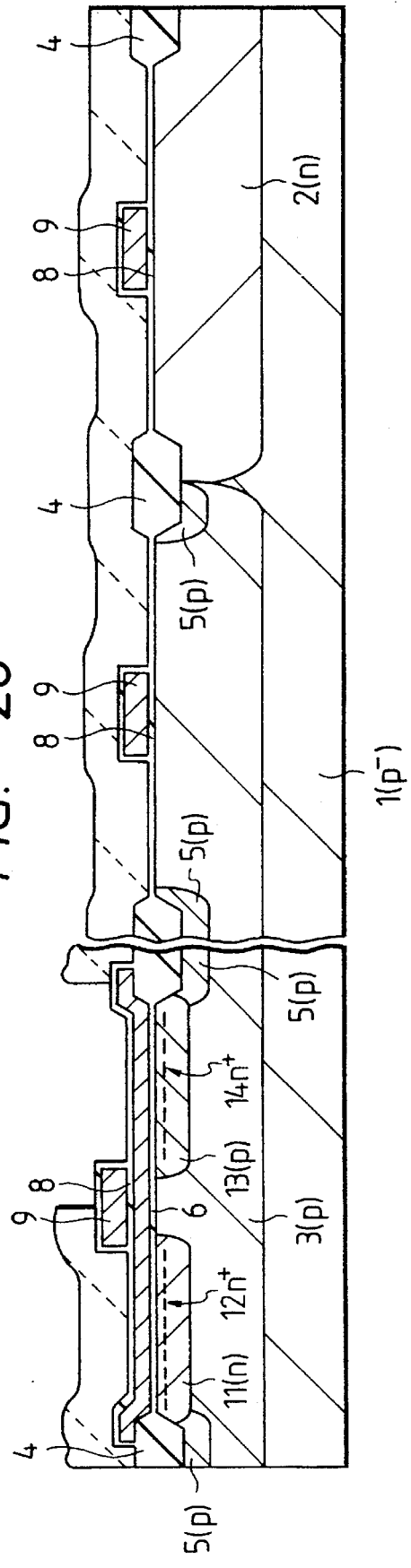

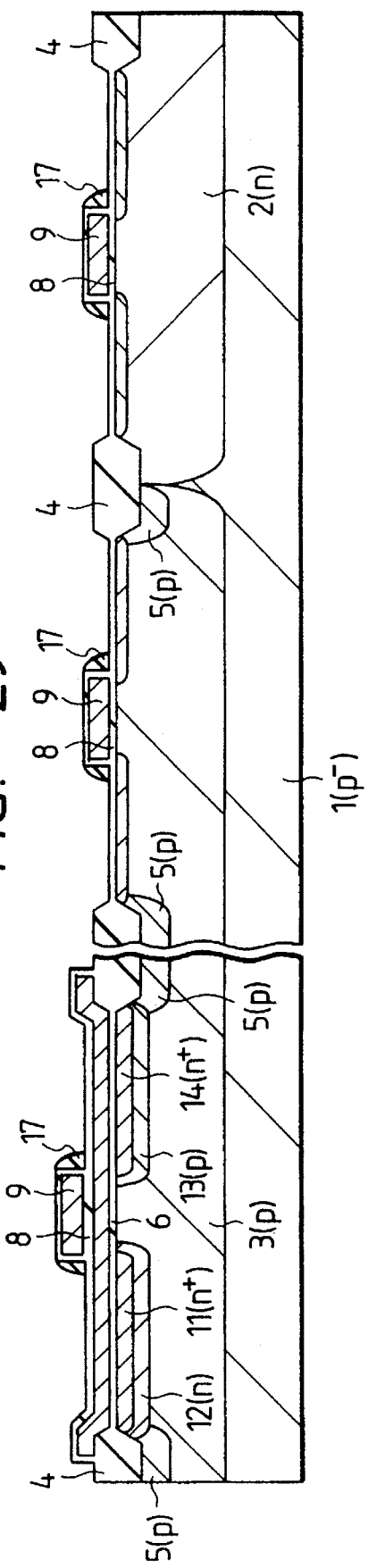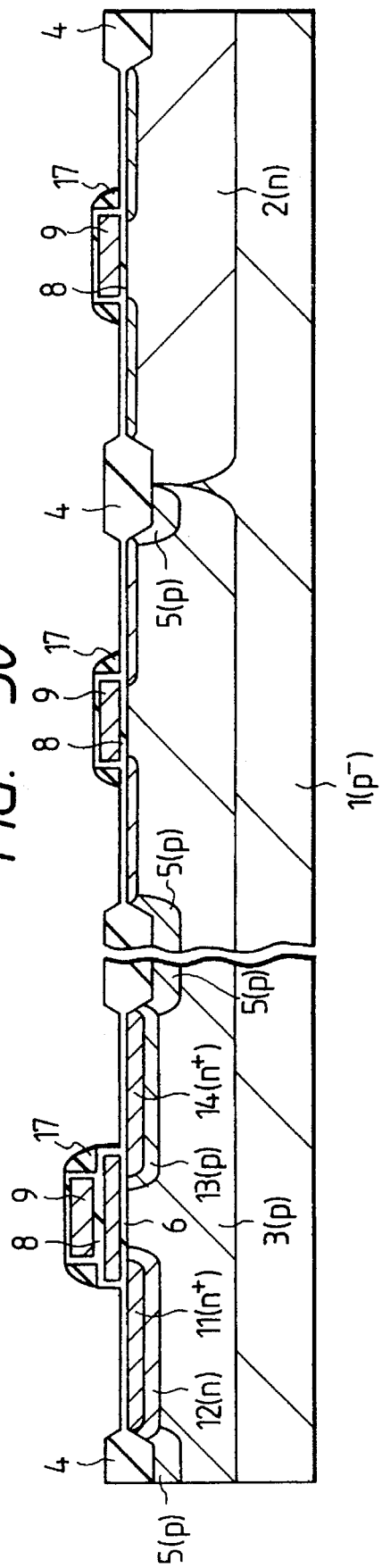

SEMICONDUCTOR INTEGRATED CIRCUIT DEVICE AND METHOD OF MANUFACTURING THE SAME

This application is a Continuation application of application Ser. No. 08/147,037, filed Nov. 4, 1993, now U.S. Pat. No. 5,445,980, which is a Continuation application of application Ser. No. 07/914,542, filed Jul. 16, 1992, abandoned, which is a Divisional application of application Ser. No. 07/794,648, filed Nov. 18, 1991, now U.S. Pat No. 5,153,144 which is a Continuation application of application Ser. No. 07/349,221, filed May 8, 1989 now abandoned.

BACKGROUND OF THE INVENTION

The present invention relates to a semiconductor integrated circuit device, and a method of manufacturing the same. More particularly, it relates to techniques which are effective when applied to a semiconductor integrated circuit device having a nonvolatile memory.

A nonvolatile memory cell of the one-element type has been proposed as the nonvolatile memory cell of an EEPROM (Electrically Erasable Programmable Read Only Memory). This nonvolatile memory cell is constructed of a field-effect transistor (MISFET) which has a floating gate electrode (information storing gate electrode) and a control gate electrode (controlling gate electrode). The source region of the MISFET is connected to a source line, and the drain region to a data line.

The nonvolatile memory cell is called a "flash type nonvolatile memory cell", in which information is written with hot electrons and is erased by tunneling. More specifically, the information writing operation of the nonvolatile memory cell is carried out in such a way that hot electrons are generated by a high electric field in the vicinity of the drain region and are injected into the floating gate electrode. On the other hand, the information erasing operation of the nonvolatile memory cell is carried out in such a way that the electrons stored in the floating gate electrode are emitted into the source region by the Fowler-Nordheim type tunneling.

Since the area of the flash type nonvolatile memory cell can be reduced owing to the single-element type as stated above, the EEPROM configured of the cells has the feature that a larger memory capacity can be achieved.

By the way, the EEPROM mentioned above is explained in "1988 IEEE International Solid-State Circuits Conference", pp. 132–133 and 330.

SUMMARY OF THE INVENTION

The inventor made studies on the EEPROM referred to above. As a result, the following problems have been revealed:

The dispersion of erasing characteristics is wide among the memory cells, and the number of times which each cell can be repeatedly rewritten is comparatively small, so that the reliability of the EEPROM is somewhat inferior.

The erasing characteristics depend greatly upon the shape of the floating gate electrode, especially the shape of the ends of this gate electrode. An electric field which is applied between the floating gate electrode and the source region in the erasing operation is as high as $10^8$ [V/m] or above. Nevertheless, the electric field does not exhibit a uniform intensity distribution, but it tends to concentrate distortionally on the ends of the gate electrode, particularly the corners thereof, due to a so-called edge effect. Consequently, a slight dispersion in the shapes of the floating gate electrodes brings the erasing characteristics a wide dispersion.

Moreover, when the applied electric field in the erasing operation concentrates partially on any specific portion, the breakdown or degradation of an insulator film is liable to occur in the specific portion. This decreases the number of times which an erasing voltage is applied, namely, the number of times which the memory cell is repeatedly rewritten.

Besides, since the source region is formed by the process of ion implantation in self-alignment to the floating gate electrode as well as the control gate electrode, the overlap area between the source region and the floating gate electrode cannot be set sufficiently large. Therefore, a wide dispersion is caused in the erasing characteristics by a dispersion in the processing steps.

Further, the implantation of arsenic ions for forming the source region is performed through an insulator film, for example, thermal oxidation film which is formed on the front surface of a semiconductor substrate. On that occasion, a dangling bond is produced in the part of the oxide film corresponding to the end of the floating gate electrode. A leakage current ascribable to the dangling bond flows between the floating gate electrode and the source region, so that the withstand voltage between the floating gate electrode and the source region lowers to decrease the number of times which the memory cell is repeatedly rewritten. Moreover, such leakage currents cause the dispersion of the erasing characteristics among the memory cells.

An object of the present invention is to provide techniques that narrow the dispersion of erasing characteristics among memory cells and increase the number of times which each cell can be repeatedly rewritten, thereby to realize a nonvolatile memory of high reliability.

The above and other objects and novel features of the present invention will become apparent from the description of this specification and the accompanying drawings.

BRIEF DESCRIPTION OF THE DRAWINGS

FIGS. 5 thru 19 are sectional views showing the manufacturing steps of the EEPROM;

FIGS. 23 thru 30 are sectional views showing the manufacturing steps of the EEPROM of the third embodiment;

DESCRIPTION OF THE PREFERRED EMBODIMENTS

Figure 1:
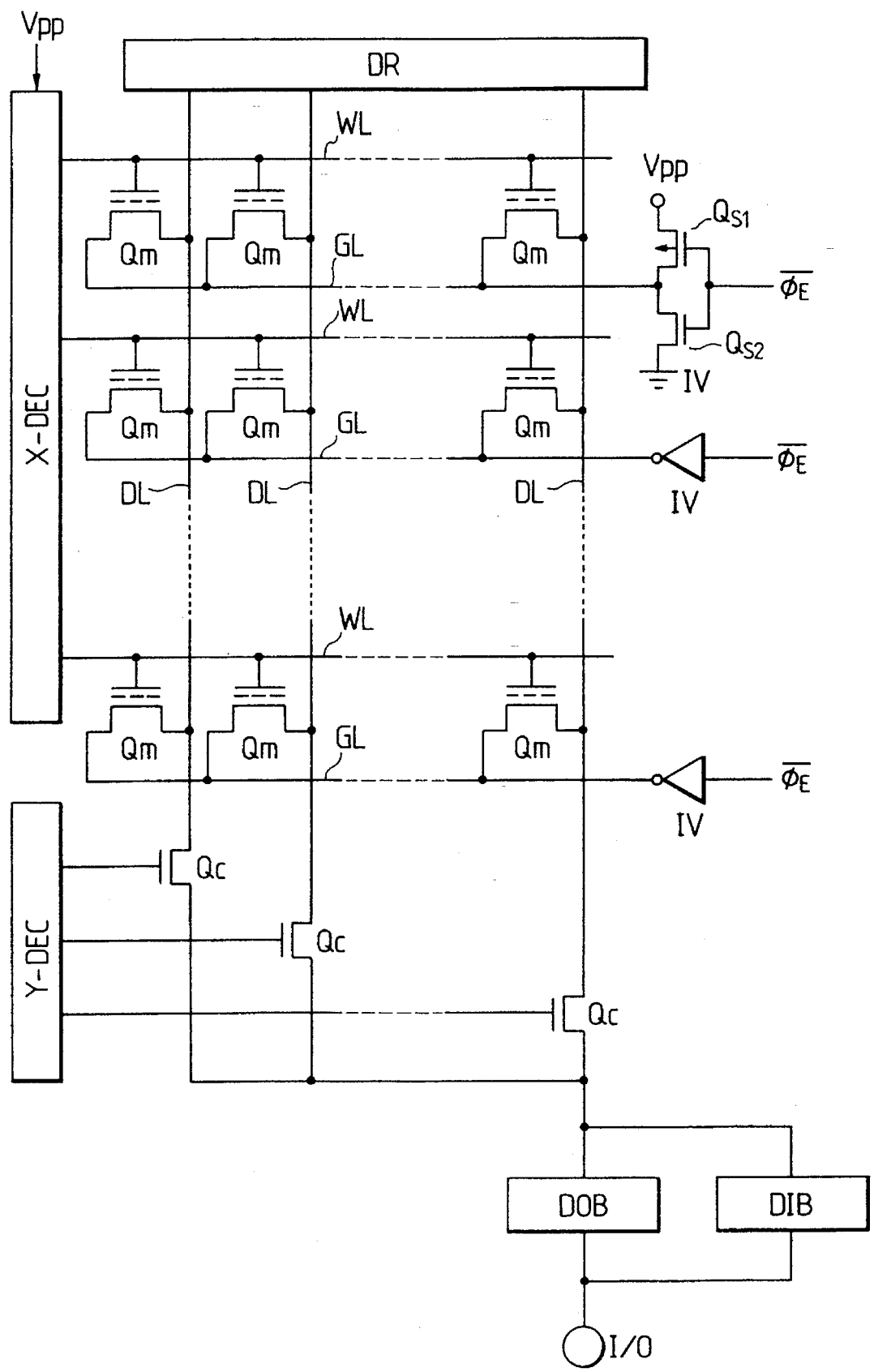
FIG. 1 is an equivalent circuit diagram of a memory cell array and some of peripheral circuits in an EEPROM according to the present invention.
Figure 2:
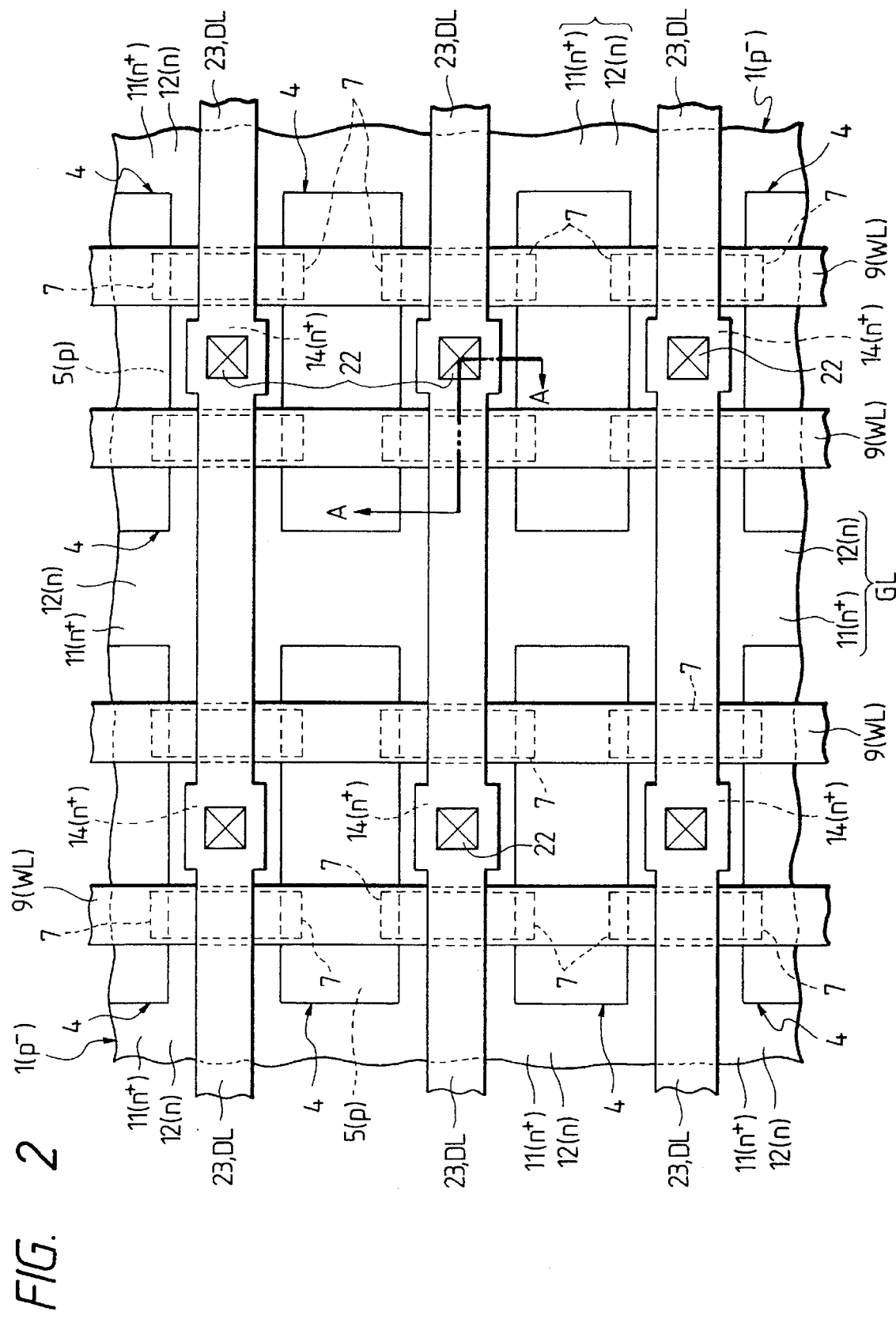
FIG. 2 is a plan view of the essential portions of the memory cell array.

FIG. 1 is an equivalent circuit diagram of a memory cell array and some of peripheral circuits in an EEPROM to which the present invention is applied, while FIG. 2 is a plan view of part of the memory cell array.

The EEPROM will be outlined with reference to FIG. 1.

A memory cell $Q_m$ is constructed of a MISFET which has a floating gate electrode and a control gate electrode. The control gate electrode of the MISFET $Q_m$ is connected to a word line WL. The drain region of the MISFET $Q_m$ is connected to a data line DL, and the source region to a ground potential line GL. The word lines WL and the ground lines GL are laid in parallel with one another, and in a direction in which they intersect the data lines DL. That is, the memory cell array is configured of the memory cells $Q_m$, word lines WL, data lines DL and ground lines GL. One end of each word line WL is connected to an X-decoder X-DEC which is a word line selecting circuit. One end of each data line DL is connected to a drive circuit DR for the data lines DL, while the other end thereof is connected to data input/output buffers DIB and DOB through an n-channel MISFET $Q_c$ constituting a column switch circuit. The gate electrode of the MISFET $Q_c$ is supplied with the output of a Y-decoder Y-DEC which is a data line selecting circuit. The ground line GL is supplied with the output of a CMOS inverter circuit IV which comprises a p-channel MISFET $Q_{S1}$ and an n-channel MISFET $Q_{S2}$. An erase signal $\overline{\phi_E}$ is supplied to the input terminal of the inverter circuit IV, namely, the gate electrodes of the MISFETs $Q_{S1}$ and $Q_{S2}$. In a data reading operation, the output circuit DOB including a sense amplifier amplifies a signal applied to the selected one of the data lines DL and delivers the amplified signal to an input/output external terminal I/O. In a data writing operation, the input circuit DIB feeds the selected data line DL with a signal applied to the external terminal I/O. The circuits other than the memory cell array, namely, the peripheral circuits are constructed of CMOS circuits similarly to the inverter circuits IV, and they perform static operations.

The writing, reading and erasing operations of this EEPROM proceed as stated below.

In the operations of writing and reading information, the inverter circuit IV applies the ground potential $V_{SS}$ of circuitry, for example, 0 [V] to the ground line GL through the MISFET $Q_{S2}$ which is turned "on" by the high level of the signal $\overline{\phi_E}$, and in the operation of erasing information, it applies an erase potential $V_{pp}$, for example, 12 [V] through the MISFET $Q_{S1}$ which is turned "on" by the low level of the signal $\overline{\phi_E}$. In the information erasing operation, under the state under which the potential $V_{PP}$ of, for example, 12 [V] is applied to the inverter circuits IV so as to hold the ground lines GL at 12 [V], all the word lines WL and all the data lines DL are brought to low levels by the circuits X-DEC and Y-DEC having received the signal $\overline{\phi_E}$. That is, the contents of all the memory cells $Q_m$ are erased at one time in this embodiment.

In the writing operation, a power source potential $V_{CC}$ (of, for example, 5 [V]) is applied from the writing circuit DIB to one data line DL selected by the decoder Y-DEC. In advance of the voltage application, all the data lines DL are precharged to the ground potential $V_{SS}$ of the circuitry, for example, 0 [V] by the drive circuit DR. In the reading operation, all the data lines DL are precharged to the power source potential $V_{CC}$ by the drive circuit DR beforehand. Thereafter, a potential which corresponds to the stored data of one selected memory cell $Q_m$ appears on the data line DL.

In the writing operation, the high voltage $V_{PP}$ (of, for example, 12 [V]) above the power source voltage $V_{CC}$ is supplied from the decoder X-DEC to one selected word line WL. In the reading operation, a high level signal equal to (or lower than) the power source voltage $V_{CC}$ is applied from the decoder X-DEC to one selected word line WL. In a case where the threshold voltage of the MISFET of the memory cell $Q_m$ is lower than the selection level of the word line WL, the potential of the data line DL is lowered from the potential $V_{CC}$ by the turn-on of the MISFET $Q_m$. On the other hand, in a case where the threshold voltage of the MISFET $Q_m$ is higher than the selection level of the word line WL, the data line DL holds its precharge level at the time of the turn-off of the MISFET $Q_m$.

By the way, the writing operation, i.e., the injection of hot carriers is performed in only one memory cell for which the potential $V_{PP}$ is applied to the word line WL and the potential $V_{CC}$ to the data line DL. The hot carriers are not injected in the other memory cells.

The high voltage $V_{PP}$ may be supplied from an external terminal in the writing operation, or may well be produced from the power source voltage $V_{CC}$ by a built-in booster circuit.

Figure 3:
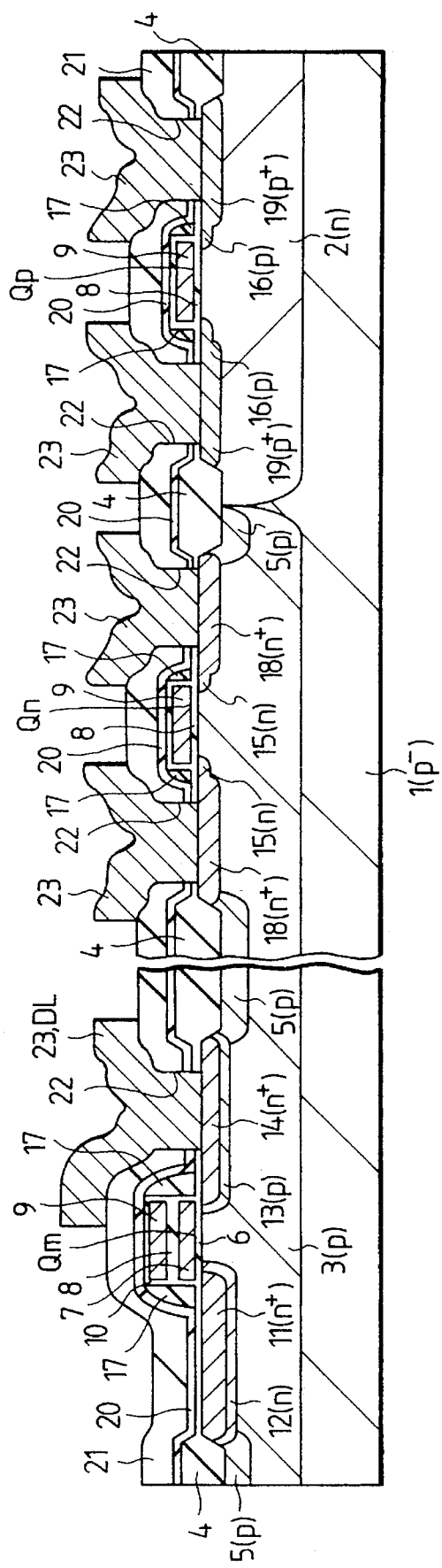
FIG. 3 is a sectional view showing N-channel and P-channel MISFETs for memory cells and the peripheral circuits.

FIG. 3 is a sectional view of p-channel and n-channel MISFETs which constitute the memory cell and peripheral circuit of an EEPROM being the first embodiment of the present invention. The section of the memory cell in FIG. 3 is taken along A—A in FIG. 2.

As shown in FIG. 3, the EEPROM is constructed using a p$^-$-type semiconductor substrate 1 which is made of single-crystal silicon. A p-type well region 3 is provided in the principal surface part of the semiconductor substrate 1 in domains for forming the flash type nonvolatile memory cell $Q_m$ and the n-channel MISFET $Q_n$, while an n-type well region 2 is provided in a domain for forming the p-channel MISFET $Q_p$.

An insulator film 4 for isolating the elements is provided between the adjacent domains for forming the elements, and on the principal surface parts of the n-type well region 2 and the p-type well region 3. In the principal surface part of the p-type well region 3, a p-type channel stopper region 5 is provided under the element isolating insulator film 4.

The flash type nonvolatile memory cell $Q_m$ is constructed in the principal surface of the p-type well region 3 within the domain whose perimeter is defined by the element isolating insulator film 4 and the channel stopper region 5. More specifically, the flash type nonvolatile memory cell $Q_m$ is configured of the p-type well region 3, a first gate insulator film 6, a floating gate electrode 7, a second gate insulator film 8, a control gate electrode 9, a source region and a drain region. This flash type nonvolatile memory cell $Q_m$ is of the single-element type and is made up of an n-channel field-effect transistor.

The p-type well region 3 is used as a channel forming region.

The first gate insulator film 6 is formed of a silicon oxide film which is produced by oxidizing the front surface of the p-type well region 3. It is formed at a thickness of, for example, about 100–150 [Å].

The floating gate electrode 7 is formed of, for example, a polycrystalline silicon film into which an n-type impurity is introduced.

The second gate insulator film 8 is formed of, for example, a silicon oxide film which is produced by oxidizing the surface of the floating gate electrode 7 (the polycrystalline silicon film). It is formed at a thickness of, for example, about 200–250 [Å].

The control gate electrode 9 is formed of, for example, a polycrystalline silicon film into which an n-type impurity is introduced. Alternatively, the control gate electrode 9 may well be formed of a single layer which is a film of refractory metal such as W, Ta, Ti or Mo or a film of any of refractory metal silicides, or a composite film (including a poly-cide film) in which one or more of such metal films is/are stacked on a polycrystalline silicon film. This control gate electrode 9 is formed unitarily with the control gate electrodes 9 of other flash type nonvolatile memory cells $Q_m$ arranged adjoining the particular cell $Q_m$ in the direction of the gate width thereof, whereby the word line (WL) is constructed.

The source region is made up of an $n^+$-type semiconductor region 11 of high impurity concentration and an n-type semiconductor region 12 of low impurity concentration. The n-type semiconductor region 12 is provided along the outer periphery of the $n^+$-type semiconductor region 11. That is, the source region is constructed of a so-called double diffusion structure. The $n^+$-type semiconductor region 11 of high impurity concentration is chiefly intended to heighten the impurity concentration of the source region and to increase the junction depth thereof. The n-type semiconductor region 12 of low impurity concentration is chiefly intended to increase the junction depth. More specifically, the source region has its impurity concentration raised by the $n^+$-type semiconductor region 11 lest its front surface should be depleted when the high voltage is applied between this source region and the control gate electrode 9 in the information erasing operation. In addition, the source region has its diffusion magnitude (diffusion distance) toward the channel forming region increased by the $n^+$-type semiconductor region 11 of high impurity concentration or/and the n-type semiconductor region 12 of low impurity concentration, whereby the overlap area (overlap magnitude) between this source region and the floating gate electrode 7 is increased to enlarge a tunneling area in the information erasing operation. The semiconductor regions 11 and 12 are respectively formed in self-alignment with the gate electrodes 7 and 9.

The drain region is made up of an $n^+$-type semiconductor region 14 of high impurity concentration. The $n^+$-type semiconductor region 14 is formed in self-alignment with the floating gate electrode 7 and the control gate electrode 9.

A p-type semiconductor region 13 of low impurity concentration is provided in the principal surface part of the semiconductor substrate 1 extending along the outer periphery of the drain region 14. The p-type semiconductor region 13 is intended to heighten the intensity of an electric field in the vicinity of the drain region 14, especially to promote the generation of hot electrons in the flash type nonvolatile memory cell $Q_m$ under the selected state during the information writing operation, thereby making it possible to enhance the efficiency of writing information.

The peripheral circuit is constructed of a CMOS circuit in which an n-channel MISFET $Q_n$ and a p-channel MISFET $Q_p$ are connected in series. The n-channel MISFET $Q_n$ has an LDD (Lightly Doped Drain) structure having source and drain regions each of which is configured of a region 15(n) of low impurity concentration and a region 18($n^+$) of high impurity concentration, while the p-channel MISFET $Q_p$ has an LDD structure having source and drain regions each of which is configured of a region 16(p) of low impurity concentration and a region 19($p^+$) of high impurity concentration. Each of the low impurity concentration regions 15(n) and 16(p) is formed in self-alignment with the gate electrode 9 of the corresponding MISFET, and each of the high impurity concentration regions 18($n^+$) and 19($p^+$) is formed in self-alignment with both the gate electrode 9 and side walls 17 provided at both the ends thereof. Further, the gate electrodes 9 of such n-channel MISFETs $Q_n$ and p-channel MISFETs $Q_p$ are formed of the same layer as that of the control gate electrodes 9 of the flash type nonvolatile memory cells $Q_m$.

wiring 23 made of an aluminum alloy film is connected to the $n^+$-type semiconductor region 14 which is the drain region of the flash type nonvolatile memory cell $Q_m$, and it functions as the data line DL.

Further, if necessary, the wiring 23 is connected to the source and drain regions of the n- and p-channel MISFETs $Q_n$ and $Q_p$ which constitute the peripheral circuit. The wiring 23 is extended on inter-layer insulator films 20 and 21, and is connected to the $p^+$- and $n^+$-type semiconductor regions through contact holes 22 formed in the inter-layer insulator films 20 and 21.

Figure 4:
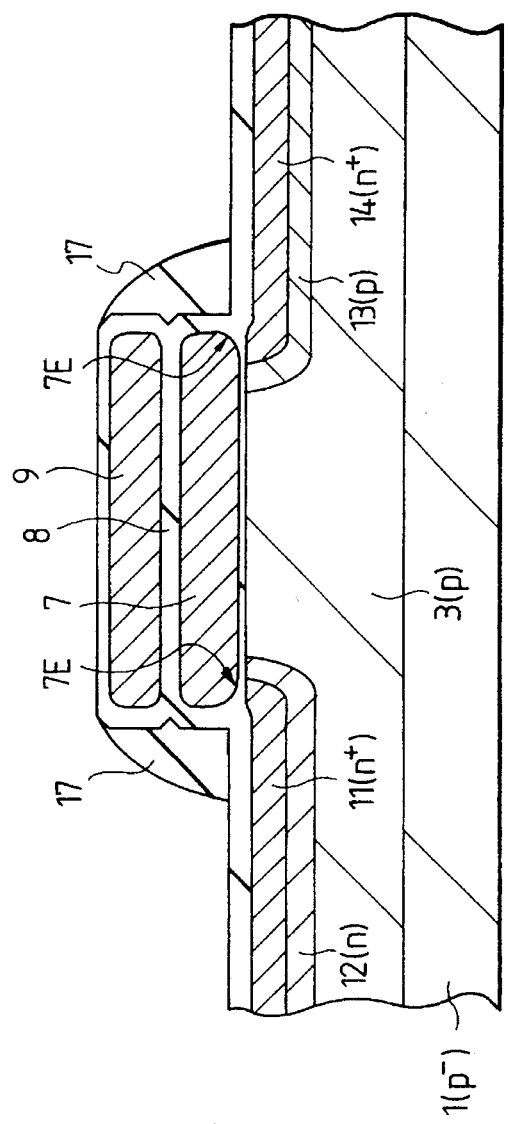
FIG. 4 is an enlarged sectional view of the gate portion of the memory cell.

FIG. 4 is an enlarged view of the flash type nonvolatile memory cell $Q_m$ shown in FIG. 3. Although not clearly depicted in FIG. 3, the lower corners 7E of both the ends of the floating gate electrode 7 are rounded. Owing to such a structure in which the corners 7E of the floating gate electrode 7 are rounded, the electric field can be prevented from concentrating on the corners. Thus, the dielectric breakdown of the parts of the insulator film corresponding to the edges of the floating gate electrode 7 can be avoided, and the erasing and writing numbers of times of the EEPROM can be increased.

A process for rounding the corners 7E in this manner will be described later.

Now, a method of manufacturing the EEPROM will be briefly described with reference to FIGS. 5 thru 19 (sectional views of essential portions showing respective manufacturing steps).

First, a $p^-$-type semiconductor substrate 1 is prepared.

Subsequently, in each domain for forming a p-channel MISFET $Q_p$, an n-type well region 2 is formed in the principal surface part of the semiconductor substrate 1. The n-type well region 2 is formed in such a way that the ions of an impurity, for example, phosphorus ions $P^+$ are implanted at a dose on the order of, for example, $1 \times 10^{13}$–$3 \times 10^{13}$ [atoms/cm$^2$] by an energy level of 100–150 [keV]. Thereafter, in each of individual regions for forming a flash type nonvolatile memory cell $Q_m$ and an n-channel MISFET $Q_n$, a p-type well region 3 is formed in such a way that the ions of an impurity, for example, boron fluoride ions $BF_2^+$ at a dose on the order of, for example, $5 \times 10^{12}$–$1 \times 10^{13}$ [atoms/cm$^2$] are implanted into the region of the principal surface part of the semiconductor substrate 1 outside the n-type well region 2, by an energy level of 50–70 [keV].

Subsequently, an insulator film 4 for isolating elements, which is about 6000–8000 [Å] thick, is formed on the principal surfaces of the n-type well region 2 and the p-type well region 3, and a p-type channel stopper region 5 is formed in the principal surface part of the p-type well region 3.

At the next step as shown in FIG. 5, a first gate insulator film 6 which is about 100–150 [Å] thick is formed on the principal surface of each of the n-type well region 2 and the p-type well region 3 in the domains for forming the semiconductor elements.

Next, a conductor film 7A is formed to a thickness of about 2000–3000 [Å] on the whole front surface of the substrate including the first gate insulator films 6. The conductor film 7A is formed of, for example, a polycrystalline silicon film deposited by CVD. An n-type impurity, for example, P is introduced into the polycrystalline silicon film, to lower the resistance thereof. Thereafter, the conductor film 7A is patterned into a predetermined shape as shown in FIG. 6. This conductor film 7A is left in only the domain for forming the flash type nonvolatile memory cell $Q_m$, and has its size in direction of a channel width stipulated.

Next, in the domain for forming the flash type nonvolatile memory cell $Q_m$, a second gate insulator film 8 having a thickness of about 200–250 [Å] is formed on the front surface of the conductor film 7A. By substantially the same manufacturing step as this step for the aforementioned film 8, second gate insulator films 8 are respectively formed on the principal surface of the part of the p-type well region 3 in the domain for forming the n-channel MISFET $Q_n$ and on the principal surface of the n-type well region 2 in the domain for forming the p-channel MISFET $Q_p$. Thereafter, as shown in FIG. 7, a conductor film 9A is formed to a thickness of about 1000–1500 [Å] on the whole substrate surface including the second gate insulator films 8. The conductor film 9A is formed of, for example, a polycrystalline silicon film deposited by CVD. The polycrystalline silicon film has its resistance lowered by introducing an n-type impurity, for example, P thereinto.

Subsequently, in the domain for forming the flash type nonvolatile memory cell $Q_m$, the respective conductor films 9A and 7A are successively patterned to form a control gate electrode 9 and a floating gate electrode 7. The patterning is carried out by a so-called stack-cutting technique which employs anisotropic etching such as RIE. Thereafter, the parts of the conductor film 9A in the domains for forming the elements of a peripheral circuit are patterned to form control gate electrodes 9. Here, these control gate electrodes 9 are respectively formed unitarily with word lines WL. In order to lower the resistance of each word line WL, therefore, the polycrystalline silicon film may well be replaced with a single layer which is made up of a film of a refractory metal such as Ta, Ti, W or Mo or any silicide of the refractory metal or with a poly-cide film in which a refractory metal silicide film is stacked on a polycrystalline silicon film. Thereafter, the whole substrate surface is subjected to an oxidizing treatment, whereby an insulator film 10 covering the front surfaces of the respective gate electrodes 7 and 9 is formed to a thickness of about 70–80 [Å] on the semiconductor substrate as shown in FIG. 8.

Subsequently, an impurity introducing mask 30 is formed which is open in an area for forming the source region of the flash type nonvolatile memory cell $Q_m$. The impurity introducing mask 30 is formed of, for example, a photoresist film. Thereafter, as illustrated in FIG. 9, using the impurity introducing mask 30, an n-type impurity $12n$ is introduced into that principal surface part of the p-type well region 3 which is to form the source region. As an example of the n-type impurity $12n$, P ions at a dose on the order of $1\times10^{14}$–$1\times10^{15}$ [atoms/cm$^2$] are introduced by ion implantation at an energy level of about 50 [keV]. The n-type impurity $12n$ is introduced in self-alignment with the floating gate electrode 7 and the control gate electrode 9. After the ion implantation, the impurity introducing mask 30 is removed.

At the next step, an impurity introducing mask 31 is formed which is open in an area for forming the drain region of the flash type nonvolatile memory cell $Q_m$. The impurity introducing mask 31 is formed of, for example, a photoresist film. Thereafter, as illustrated in FIG. 10, using the impurity introducing mask 31, a p-type impurity $13p$ is introduced into that principal surface part of the p-type well region 3 which is to form the drain region. As an example of the p-type impurity $13p$, BF$_2$ ions at a dose on the order of $5\times10^{13}$–$1.5\times10^{14}$ [atoms/cm$^2$] are introduced by ion implantation at an energy level of about 60 [keV]. The p-type impurity $13p$ is introduced in self-alignment with the floating gate electrode 7 and the control gate electrode 9. After the ion implantation, the impurity introducing mask 31 is removed.

Next, the resulting substrate is annealed at about 1000 [° C.] in an atmosphere of nitrogen gas, whereby the introduced n-type impurity $12n$ and p-type impurity $13p$ are respectively subjected to drive-in diffusions. An n-type semiconductor region 12 can be formed by the diffusion of the n-type impurity $12n$. The n-type semiconductor region 12 is formed at a great junction depth of about 0.5 [μm], on the other hand, a p-type semiconductor region 13 of low impurity concentration can be formed by the diffusion of the p-type impurity $13p$. The p-type semiconductor region 13 is formed at a small junction depth of about 0.3–0.5 [μm].

Next, an impurity introducing mask 32 is formed which is open in an area for forming the source region of the flash type nonvolatile memory cell $Q_m$. The impurity introducing mask 32 is formed of, for example, a photoresist film. Thereafter, as illustrated in FIG. 11, using the impurity introducing mask 32, an n$^+$-type impurity $11n^+$ is introduced into that principal surface part of the p-type well 3 which is to form the source region. As an example of the n$^+$-type impurity $11n^+$, As ions at a dose on the order of $5\times10^{15}$–$1\times10^{16}$ [atoms/cm$^2$] are introduced by ion implantation at an energy level of about 60 [keV]. The n$^+$-type impurity $11n^+$ is introduced in self-alignment with the floating gate electrode 7 and the control gate electrode 9. After the ion implantation, the impurity introducing mask 32 is removed.

Subsequently, as illustrated in FIG. 12, using an impurity introducing mask 33 which is open in an area for forming the drain region of the flash type nonvolatile memory cell $Q_m$, an n$^+$-type impurity $14n^+$ is introduced into that principal surface part of the p-type well 3 which is to form the drain region. As an example of the n$^+$-type impurity $14n^+$, As ions at a dose on the order of $1\times10^{15}$–$5\times10^{15}$ [atoms/cm$^2$] are introduced by ion implantation at an energy level of about 60 [keV]. The n$^+$-type impurity $14n^+$ is introduced in self-alignment with the floating gate electrode 7 and the control gate electrode 9.

Here, the case of introducing the n$^+$-type impurities $11n^+$ and $14n^+$ at the separate steps has been described. However, when the n$^+$-type impurities $11n^+$ and $14n^+$ are set at equal doses, they may well be introduced at the same time.

At the next step, the resulting substrate is annealed at about 1000 [° C.] in an atmosphere of nitrogen gas, whereby the introduced n$^+$-type impurities $11n^+$ and $14n^+$ are respectively subjected to drive-in diffusions. Owing to the annealing, n$^+$-type impurity regions 11 and 14 are formed at junction depths of about 0.3 [μm].

At the next step, as illustrated in FIG. 13, using an impurity introducing mask 34 which is open in the domain for forming the n-channel MISFET $Q_n$, an n-type impurity $15n$ is introduced into the principal surface parts of the p-type well 3 lying on both the sides of the gate electrode 9 of the n-channel MISFET $Q_n$, in self-alignment with this gate electrode 9. As an example of the n-type impurity $15n$, P ions at a dose on the order of $1\times10^{13}$–$5\times10^{13}$ [atoms/cm$^2$] are introduced by ion implantation at an energy level of about 50 [keV].

Subsequently, as illustrated in FIG. 14, using an impurity introducing mask 35 which is open in the domain for forming the p-channel MISFET $Q_p$, a p-type impurity $16p$ is introduced into the principal surface parts of the n-type well 2 lying on both the sides of the gate electrode 9 of the p-channel MISFET $Q_p$, in self-alignment with this gate electrode 9. As an example of the p-type impurity 16p, $BF_2$ ions at a dose on the order of $5 \times 10^{12} - 1 \times 10^{13}$ [atoms/cm$^2$] are introduced by ion implantation at an energy level of about 60 [keV].

Subsequently, as shown in FIG. 15, the insulator film 10 at the substrate surface is removed by wet etching. An etchant for this step is, for example, a mixed solution which consists of fluoric acid and water at a mixing ratio of 1:99. This step eliminates the insulator film 10 which overlies the front surfaces of the source and drain regions of the flash type nonvolatile memory cell $Q_m$ and in which dangling bonds have been formed by the steps of implanting the As ions of the n$^+$-type impurities 11n$^+$ and 14n$^+$.

At the next step, the resulting substrate is subjected to an oxidizing treatment for about 20 minutes in a furnace which is held at a temperature of about 900 [° C.] and into which oxygen is kept supplied. Thus, as shown in FIG. 16, a new insulator film or oxide film 10' which is about 400–500 [Å] is formed on the substrate surface including the surfaces of the source and drain regions of the flash type nonvolatile memory cell $Q_m$. On this occasion, the insulator film 10' also covers the surfaces of the floating gate electrode 7 and the control gate electrode 9 at substantially the same thickness.

Owing to this step of oxidation, the corners of both the ends of the floating gate electrode 7 of the flush type nonvolatile memory cell $Q_m$ are rounded as shown in FIG. 4.

Moreover, owing to this annealing, the n-type impurity 15n and p-type impurity 16p of the respective MISFETs $Q_n$ and $Q_p$ undergo drive-in diffusions, and both the impurities define junction depths of about 0.1–0.2 [μm].

Subsequently, as shown in FIG. 17, side-wall spacers 17 are formed on the respective side walls of the gate electrodes 7 and 9. By way of example, the side-wall spacers 17 can be formed in such a way that a silicon oxide film is deposited on the whole front surface of the substrate by CVD, whereupon the whole substrate surface is removed by anisotropic etching such as RIE in an amount which corresponds to the thickness of the deposited film.

Since the principal surfaces of the n-type well region 2, the p-type well region 3, etc. are exposed by the anisotropic etching, an oxidizing treatment is subsequently performed to cover the exposed surfaces with a thin silicon oxide film.

Further, as seen from FIG. 17, an impurity introducing mask 36 is formed which is open in the domain of the n-channel MISFET $Q_n$, and an n$^+$-type impurity 18n$^+$ is introduced in self-alignment with the gate electrode 9 and the side walls 17. As an example of the n$^+$-type impurity 18n$^+$, As ions at a high dose on the order of $5 \times 10^{15}$ [atoms/cm$^2$] are introduced by ion implantation at an energy level of about 60 [keV].

Subsequently, as illustrated in FIG. 18, an impurity introducing mask 37 is formed which is open in the domain for forming the p-channel MISFET $Q_p$. Using the impurity introducing mask 37, a p$^+$-type impurity 19p$^+$ is introduced into the principal surface parts of the p-type semiconductor regions 16 defined by the p-type impurity 16p. As an example of the p$^+$-type impurity 19p$^+$, $BF_2$ ions at a high dose on the order of $2 \times 10^{15}$ [atoms/cm$^2$] are introduced by ion implantation at an energy level of about 60 [KeV]. The p$^+$-type impurity 19p$^+$ is introduced in self-alignment with the gate electrode 9 and the side walls 17.

Figure 19:
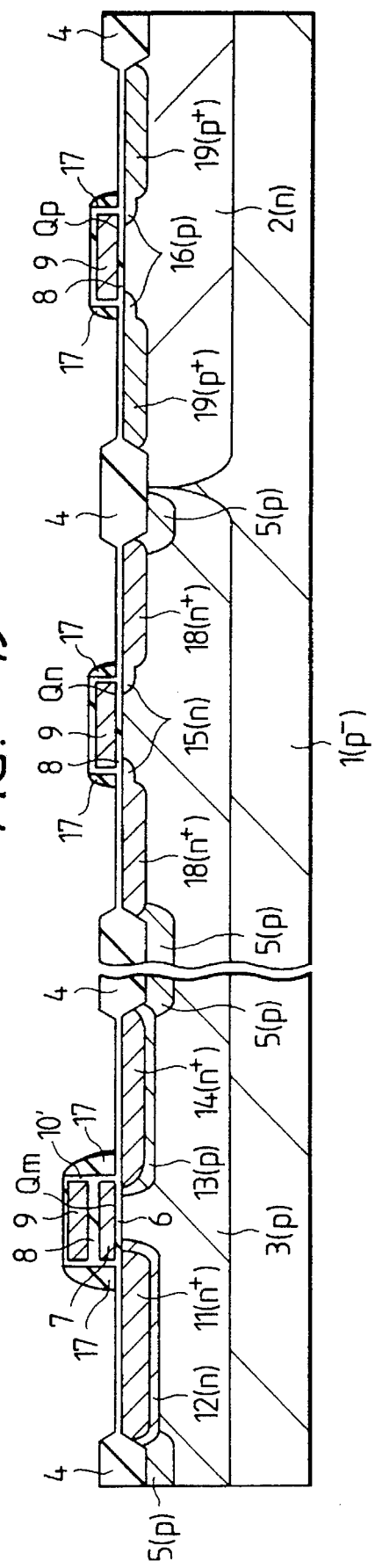

Thereafter, the resulting substrate is annealed at about 850 [°C.], whereby as shown in FIG. 19, the n$^+$-type impurity 18n$^+$ and the p$^+$ type impurity 19p$^+$ are respectively subjected to drive-in diffusions, to form n$^+$-type semiconductor regions 18 and p$^+$-type semiconductor regions 19 having junction depths of about 0.2–0.3 [μm].

Subsequently, inter-layer insulator films 20 and 21 are formed on the whole front surface of the substrate. The inter-layer insulator film 20 is an oxide film having a thickness of about 1500 [Å] as formed by the thermodecomposition of organosilane, while the inter-layer insulator film 21 is a BPSG film having a thickness of 5000–6000 [Å] as formed by, e.g., CVD.

Further, contact holes 22 are formed in the inter-layer insulator films 20 and 21, and the inter-layer insulator film 21 is subjected to glass flow, whereupon wiring 23 is formed as shown in FIG. 3. By performing these series of manufacturing steps, the EEPROM of this embodiment is finished up. incidentally, a passivation film is provided on the wiring 23 though not shown.

In this embodiment, as explained in conjunction with FIGS. 15 and 16, the insulator film 10 is removed, and thereafter, the oxidizing step is carried out to form the insulator film 10' again. However, the insulator film 10 need not always be etched and removed, but it may be subjected to oxidization. As the reason therefor, it is considered that the dangling bonds produced by the ion implantation will be supplied with oxygen by the oxidization, thereby to disappear or decrease.

Further, even when the insulator film 10 is partly removed and is thereafter oxidized, a leakage current can be similarly prevented or suppressed.

The following effects are brought forth by this embodiment:

(1) The lower corners of the ends of a floating gate electrode are rounded, whereby an electric field can be prevented from concentrating on the corner parts, and the parts of a gate insulator film corresponding to the ends of the floating gate electrode can be prevented from breaking down or degrading, so that the number of times which each memory cell is rewritten can be increased.

(2) The lower corners of the ends of a floating gate electrode are rounded, whereby the concentration of an electric field on the corner parts can be avoided, and hence, the electric field in an erasing operation acts on a gate insulator film substantially uniformly, so that the dispersion of erasing characteristics among bits can be prevented. Moreover, even when the shapes of the ends of the floating gate electrodes disperse, the dispersion of the erasing characteristics among the bits can be prevented because tunneling in the erasing operation takes place on a channel side with respect to the end part.

(3) After the ion implantation of As ions of high dose for forming a source region, an oxide film covering a surface is removed, and a new oxide film is formed, whereby the leakage current between a floating gate electrode and the source region can be avoided, so that the dispersion of erasing characteristics can be prevented. Alternatively, oxidization is carried out after the above ion implantation, whereby dangling bonds in the oxide film can be decreased to avoid or decrease the leakage current.

Figure 20:
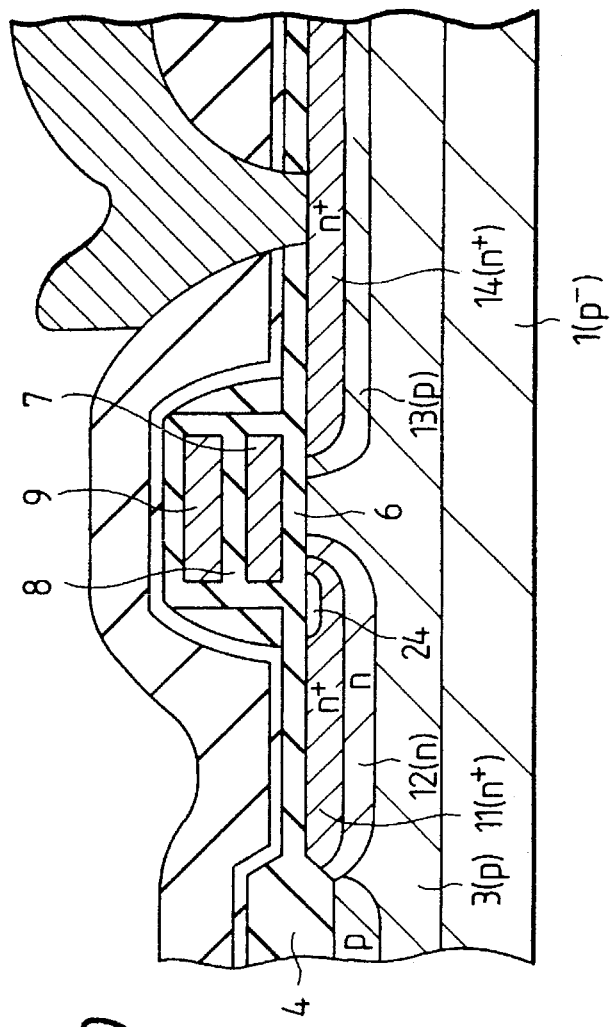
FIGS. 20 and 21 are sectional views showing the second embodiment of the present invention.

FIG. 20 shows the schematic construction of a flash type nonvolatile memory cell according to the second embodiment of the present invention.

The point of difference from the first embodiment stated before will be described. In the flash type nonvolatile memory cell according to the second embodiment depicted in the Figure, a region 24 of low impurity concentration is locally formed in the vicinity of the part of the front surface of a source region 11 underlying one end of a floating gate electrode 7, thereby to form electric field buffer means for moderating an electric field which is established between the source region 11 and the end of the floating gate electrode 7 during the application of an erasing voltage.

That is, the electric field is moderated in such a way that a depletion layer is rendered liable to spread in the surface part of the source region 11 underlying the end of the floating gate electrode 7.

Figure 21:
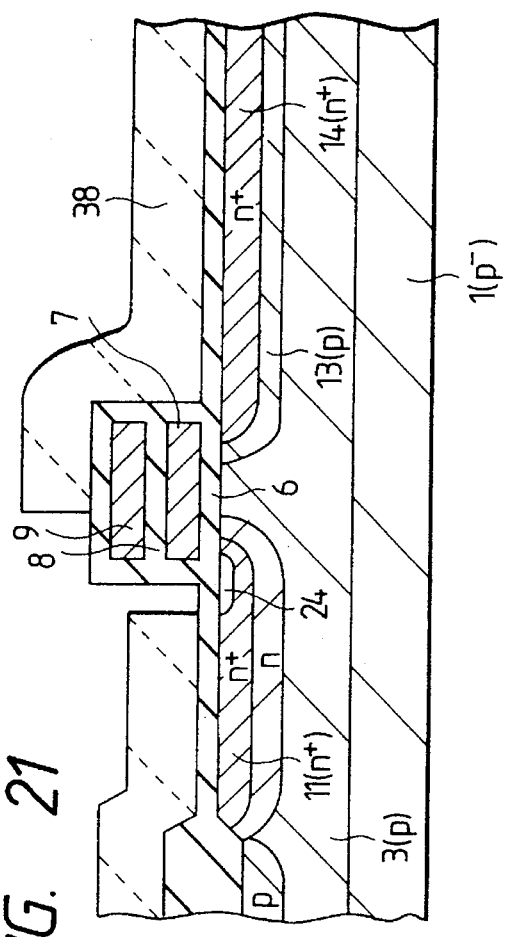

The low impurity concentration region 24 is formed in such a way that the amount of doping with a conductivity type affording impurity is decreased in the part of the source region 11. Alternatively, as shown in FIG. 21, it is formed in such a way that a p-conductivity type affording impurity is introduced locally into the $n^+$-type source region 11 down to a depth of about 0.15 [μm] by ion implantation.

When the low impurity concentration region 24 as described above is provided, the partial spread of a large depletion layer is developed in the lower impurity concentration region 24 under the end of the floating gate electrode 7 by the applied electric field in an erasing operation. The spread of the depletion layer corrects the tendency of the concentration of the electric field near the end of the floating gate electrode 7.

Thus, likewise to the case of the first embodiment stated before, the dispersion of erasing characteristics among memory cells can be narrowed, and the number of times which each memory cell is repeatedly rewritable can be enlarged, by the use of the structure which is obtained by the comparatively simple process for manufacture.

Figure 22:
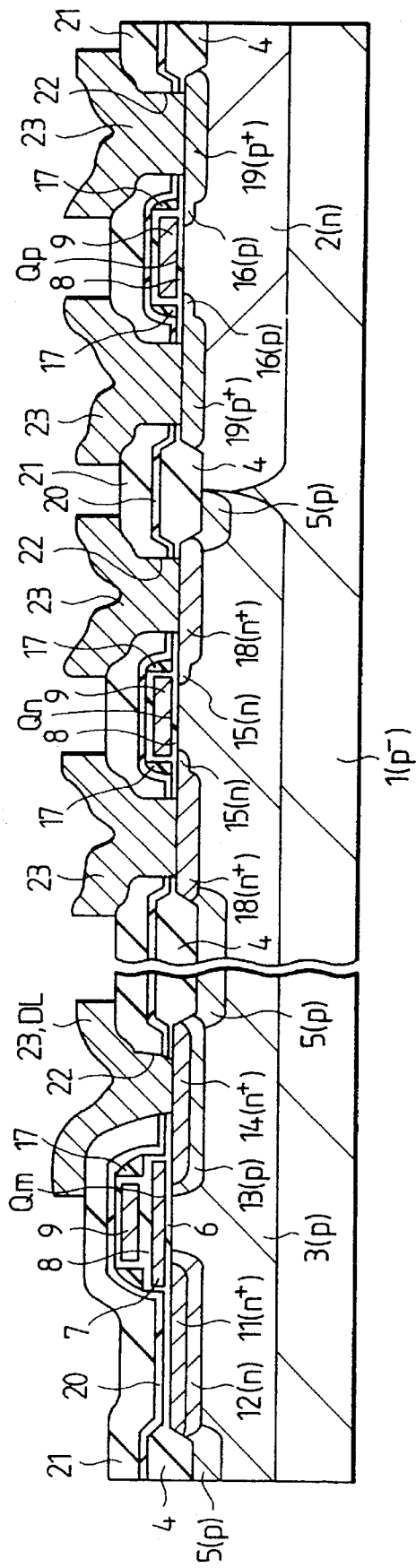
FIG. 22 is a sectional view showing the third embodiment of the present invention.

FIG. 22 shows the third embodiment of the present invention, which differs from the first embodiment in the structure of a flash type nonvolatile memory cell $Q_m$. Regarding each peripheral circuit, this embodiment is similar to the first embodiment in both the structure and manufacturing method thereof.

Accordingly, respective portions corresponding to those of the first embodiment shall be assigned the same symbols.

Likewise to that of the first embodiment, the flash type nonvolatile memory cell $Q_m$ shown in the figure is constructed of a MISFET, and it includes a floating gate electrode 7 which is provided on a semiconductor substrate 1 through a first gate insulator film 6, a control gate electrode 9 which is provided on the floating gate electrode 7 through a second gate insulator film 8, and a source region 11, 12 and a drain region 14 which are spaced from each other under the floating gate electrode 7 and each of which is formed so as to overlap the floating gate electrode 7.

Here, side-wall spacers 17 are provided on the side parts of the control gate electrode 9. The floating gate electrode 7 is formed with reference to the ends of the side-wall spacers 17. Thus, the sides of the control gate electrode 9 retreat with respect to those of the floating gate electrode 7.

In this manner, the sides of the control gate electrode 9 are withdrawn inside those of the floating gate electrode 7, and the inner ends of the source region 11, 12 and the drain region 14 are respectively extended so as to underly the sides of the control gate electrode 9, whereby comparatively large overlap parts are defined between the floating gate electrode 7 and the source region 11, 12 and between it and the drain region 14 with a good reproducibility and a good controllability.

In this case, the size of the floating gate electrode 7 is set by the side-wall spacers 17 so as to be about 0.2–0.3 [μm] larger than the size of the control gate electrode 9 at each side end.

In addition, the thicknesses of the respective layers or films of the flash type nonvolatile memory cell $Q_m$ are the same as in the first embodiment.

With the nonvolatile memory cell $Q_m$ constructed as described above, the overlap areas between the floating gate electrode 7 and the source region 11, 12 and between it and the drain region 14 are reliably secured, so that in the erasing operation of the memory cell $Q_m$, a stable tunneling current can be ensured avoiding the influences of the shape of side part of the floating gate electrode 7, etc. Thus, the dispersion of the erasing characteristics of the memory cells can be narrowed. Simultaneously, the concentration of an electric field on the end of the floating gate electrode 7 is moderated, so that an erasing voltage can be raised to heighten an erasing rate.

Now, an embodiment of a method of manufacturing the nonvolatile memory cell stated above will be described.

FIGS. 23 thru 30 illustrate the method of manufacturing the flush type nonvolatile memory cell and the peripheral circuit shown in FIG. 22.

Figure 23:
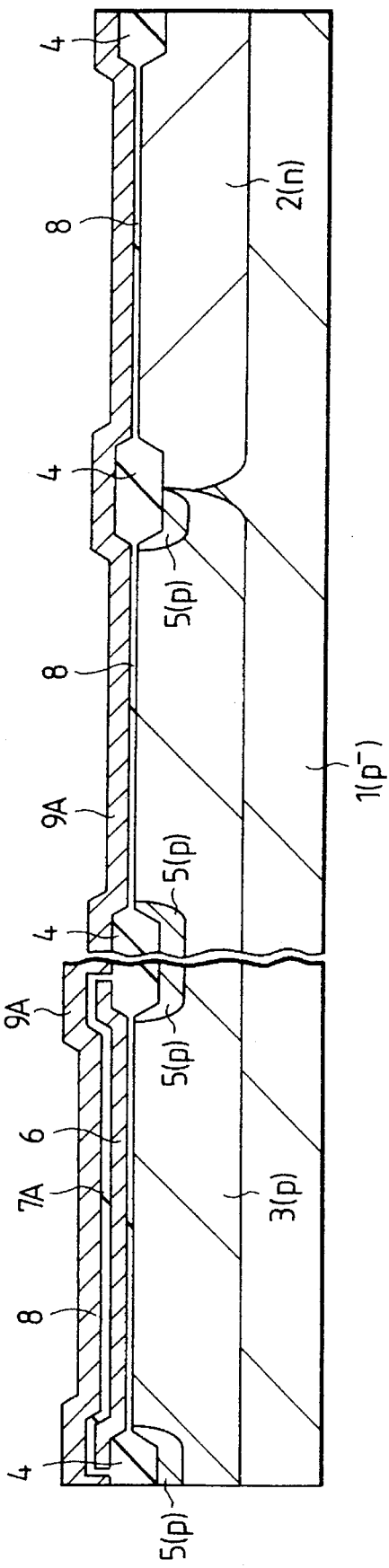

As in FIG. 7 concerning the first embodiment, a conductor film 9A which is a polycrystalline silicon film is formed on a semiconductor substrate 1 as shown in FIG. 23.

Figure 24:
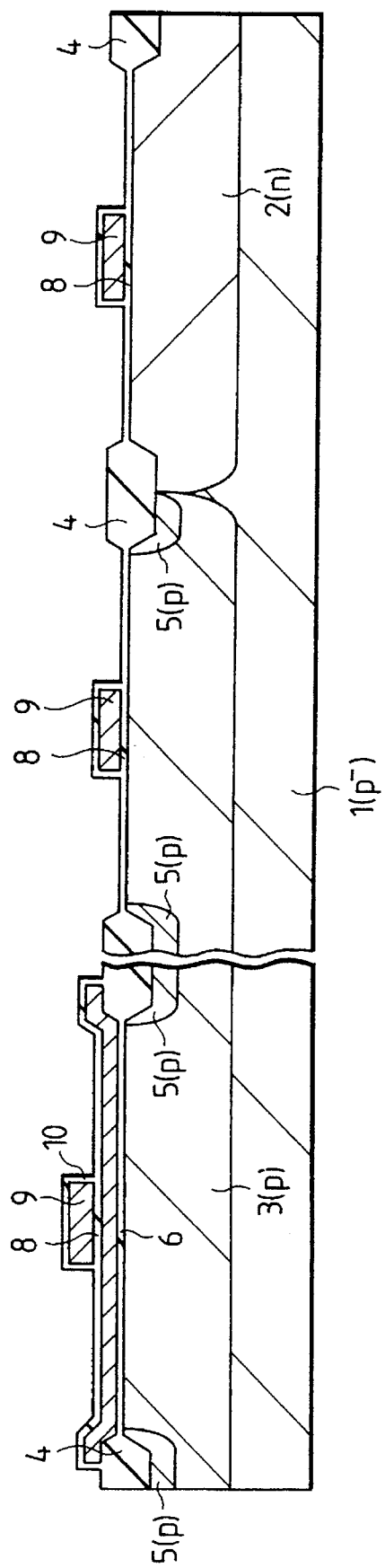
Figure 25:
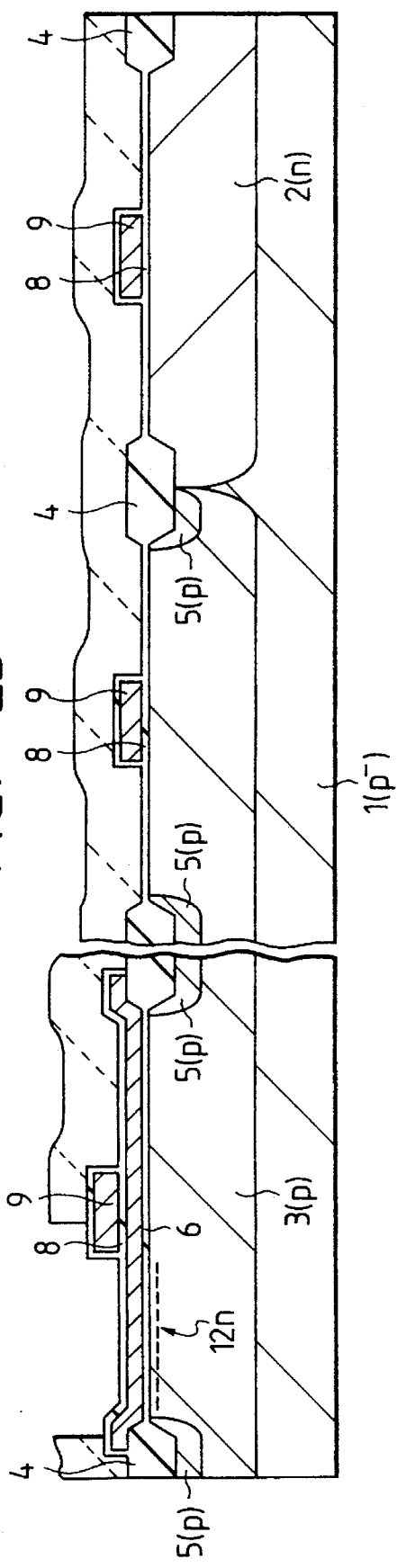
Figure 26:
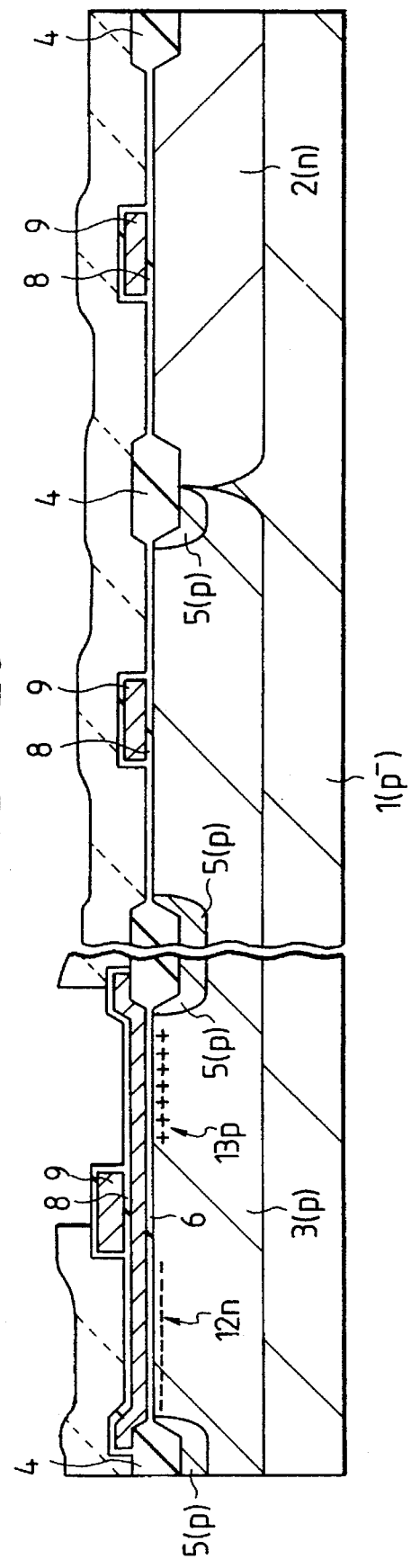

At the next step, as shown in FIG. 24, the conductor film 9A is patterned in a domain for forming the flash type nonvolatile memory cell $Q_m$ and in domains for forming n-channel and p-channel MISFETs constitutive of the peripheral circuit, thereby to form the control gate electrode 9 of the memory cell $Q_m$ and the gate electrodes 9 of the n- and p-channel MISFETs.

Next, the front surface of the resulting substrate is oxidized to form an insulator film 10.

The ensuing steps in FIGS. 25 thru 28 correspond respectively to the steps in FIGS. 9 thru 12 concerning the first embodiment, and shall be omitted from the description. However, each step of ion implantation for the memory cell $Q_m$ is carried out through a polycrystalline silicon film (7A in FIG. 23) for forming a floating gate electrode (7 in FIG. 30), in self-alignment with the control gate electrode 9. Accordingly, the energy level of the ion implantation must be set higher than in the first embodiment.

By way of example, an n-type impurity 12n is introduced by implanting $P^+$ ions at about 150 [keV], a p type impurity 13p by implanting $B^+$ ions at about 50 [keV], and $n^+$-type impurities $11n^+$ and $14n^+$ by implanting $As^+$ ions at about 250 [keV]. Thereafter, an n-type impurity 15n and a p-type impurity 16p are introduced by the same ion implantation steps as in FIG. 15 and FIG. 16 concerning the first embodiment, respectively.

Subsequently, as illustrated in FIG. 29, side walls 17 are formed on the sides of each of the control gate electrode 9 of the flush type nonvolatile memory cell $Q_m$ and the gate electrodes 9 of the n-channel and p-channel MISFETs in the same way as in FIG. 17 concerning the first embodiment.

Subsequently, as illustrated in FIG. 30, the floating gate electrode 7 of the memory cell $Q_m$ is formed in self-alignment with the control gate electrode 9 and side walls 17 thereof.

Thenceforth, processing steps similar to those of the first embodiment in FIGS. 17 et seq. are carried out to finish up the EEPROM of this embodiment According to this embodiment, the following effects are brought forth: (1) Since the overlap between a source region and a floating gate electrode can be reliably attained, the dispersion of erasing characteristics can be avoided.

(2) Since the concentration of a conductivity affording substance in the part of a source region underlying a floating gate electrode can be heightened with a good controllability, any influence ascribable to the formation of an inversion layer or the spread of a depletion layer in the front surface of a semiconductor substrate is lessened in an erasing operation, so as to apply an erasing electric field through a gate insulator film only and to increase a tunneling current, whereby erasing characteristics, especially an erasing rate can be enhanced.

(3) Microfabrication based on self-alignment is possible.

Figure 31:
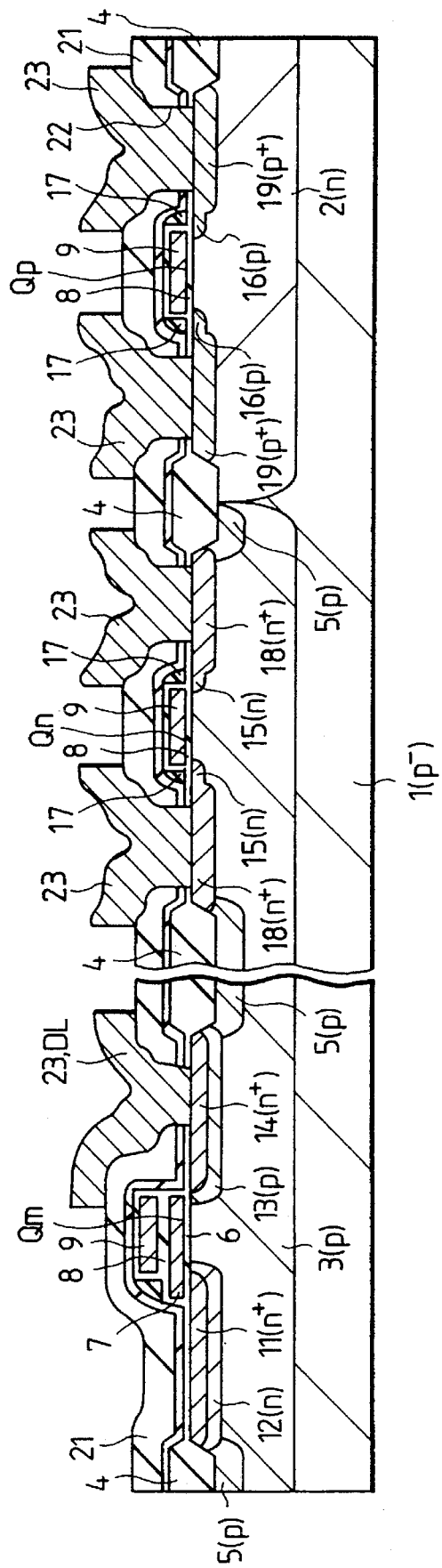
FIG. 31 is a sectional view showing a modification of the third embodiment.

Now, FIG. 31 shows a modification of the third embodiment stated above. A floating gate electrode 7 and a control gate electrode 9 are asymmetric between on the side of a source region 11, 12 and on the side of a drain region 14. In this case, the side of the floating gate electrode 7 near the source region 11, 12 is laterally protruded 0.2–0.3 [μm] beyond the control gate electrode 9 by a side-wall spacer 17 in the same manner as in the foregoing embodiment. In contrast, on the side of the floating gate electrode 17 near the drain region 14, the ends of this electrode 17 and the control gate electrode 9 are vertically aligned so as to be substantially coplanar.

Owing to such an asymmetric structure, the overlap between the source region 11, 12 and the floating gate electrode 7 can be enlarged to enhance erasing characteristics, while at the same time, the overlap between the drain region 14 and the floating gate electrode 7 can be made null or small to enhance writing characteristics.

Although, in the above, the invention made by the inventor has been described as to the embodiments in which it is applied to the flash type EEPROMs, it is also applicable to EEPROMs other than the flash type ones and to microcomputers each having a built-in EEPROM.

Figure 32:
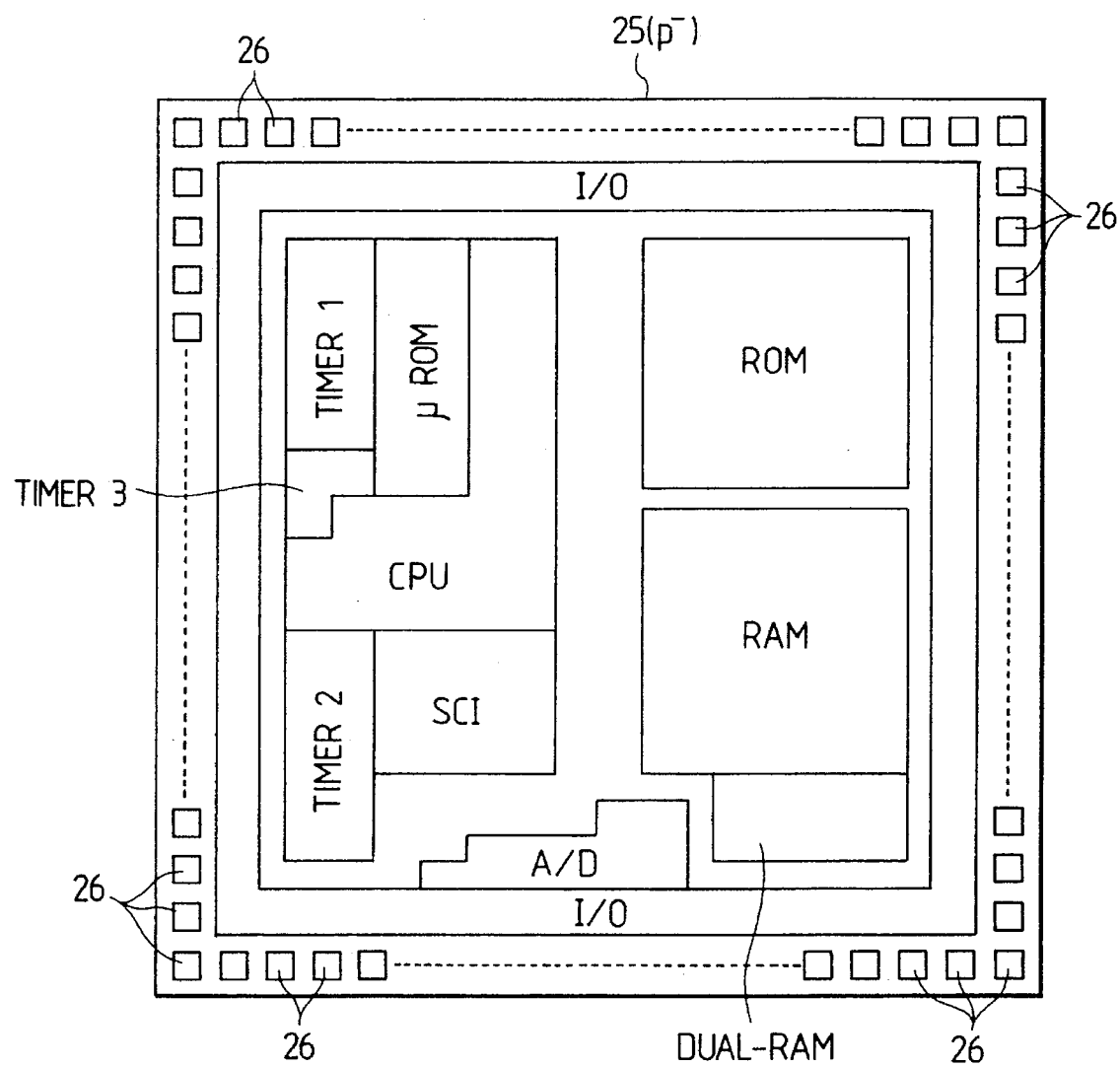
FIG. 32 is a layout plan of a microcomputer chip to which the EEPROM of the present invention is applied.

By way of example, FIG. 32 shows such a microcomputer. Referring to the figure, numeral 25 designates a semiconductor substrate (chip) which is made of p⁻-type single-crystal silicon, and whose peripheral edge has a plurality of bonding pads 26 arranged thereon. An input/output circuit area I/O is provided inside the bonding pads 26. The microcomputer chip 25 shown in FIG. 32 includes therein a μ (micro) ROM, a CPU (central processing unit), an SCI (serial communication interface), an A/D (analog-to-digital converter) circuit, a dual-RAM (dual-port Random Access Memory), a RAM, a ROM, a timer 1, a timer 2, and a timer 3. The present invention is applicable to the μ ROM, the ROM or/and the RAM.

What is claimed is:

1. A method of manufacturing a memory cell which includes a single MISFET and which comprises a first gate insulating film formed on a main surface of a semiconductor substrate, a floating gate electrode formed on said first gate insulating film, a second gate insulating film formed on said floating gate electrode and a control gate electrode formed on said second gate insulating film, said method comprising the steps of:

providing a semiconductor substrate having a main surface, with a first gate insulating film formed on said main surface and a first conductive film serving as said floating gate electrode and formed over said first gate insulating film;

forming a first insulating film on parts of said main surface corresponding to both ends of said first conductive film as viewed in a channel direction of said MISFET;

forming a first semiconductor region in said semiconductor substrate, said first semiconductor region extending to a position under said first conductive film, said forming the first semiconductor region including ion-implanting an impurity into a region of said main surface for forming said first semiconductor region, through said first insulating film, in self-alignment with said first conductive film, a film thickness of said first gate insulating film being such that electrons are transferred from said first conductive film to said first semiconductor region by tunneling through said first gate insulating film;

after said ion-implanting step, removing said first insulating film; and after said removing step, oxidizing the semiconductor substrate to form an oxide film on said region for said first semiconductor region.

2. A method of manufacturing a memory cell according to claim 1, wherein the impurity is ion-implanted such that said first semiconductor region has such an impurity concentration that a surface depletion of said first semiconductor region is reduced when a voltage is applied between said first semiconductor region and said first conductive film for transferring electrons from said first conductive film to said first semiconductor region by tunneling through said first gate insulating film.

3. A method of manufacturing a memory cell according to claim 2, wherein said first gate insulating film is made of a silicon oxide film, said first insulating film is made of a silicon oxide film, said semiconductor substrate is a silicon substrate, and said first semiconductor region has an n-type conductivity.

4. A method of manufacturing a memory cell which includes a single MISFET and which comprises a first gate insulating film formed on a main surface of a semiconductor substrate, a floating gate electrode formed on said first gate insulating film, a second gate insulating film formed on said floating gate electrode and a control gate electrode formed on said second gate insulating film, said method comprising the steps of:

providing a semiconductor substrate having a main surface, with a first gate insulating film formed on said main surface and a first conductive film serving as said floating gate electrode and formed over said first gate insulating film;

forming a first insulating film on parts of said main surface corresponding to both ends of said first conductive film as viewed in a channel direction of said MISFET;

forming a first semiconductor region in said semiconductor substrate, said first semiconductor region extending to a position under said first conductive film, said forming the first semiconductor region including ion-implanting an impurity into a region of said main surface for forming said first semiconductor region, through said first insulating film, in self-alignment with said first conductive film, a film thickness of said first gate insulating film being such that electrons are transferred from said first conductive film to said first semiconductor region by tunneling through said first gate insulating film; and after said ion-implanting step, oxidizing the semiconductor substrate and said first insulating film.

5. A method of manufacturing a memory cell according to claim 4, wherein said oxidizing step is performed so as to thicken a portion of said first gate insulating film, corresponding to ends of said first conductive film, as compared to a film thickness of another portion of said first gate insulating film.

6. A method of manufacturing a memory cell according to claim 5, wherein the impurity is ion-implanted such that said first semiconductor region has such an impurity concentration that a surface depletion of said first semiconductor region is reduced when a voltage is applied between said first semiconductor region and said first conductive film for transferring electrons from said first conductive film to said first semiconductor region by tunneling through said first gate insulating film.

7. A method of manufacturing a memory cell according to claim 6, wherein said first gate insulating film is made of a silicon oxide film, said first insulating film is made of a silicon oxide film, said semiconductor substrate is a silicon substrate, and said first semiconductor region has an n-type conductivity.

8. A method of manufacturing a memory cell according to claim 4, wherein the impurity is ion-implanted such that said first semiconductor region has such an impurity concentration that a surface depletion of said first semiconductor region is reduced when a voltage is applied between said first semiconductor region and said first conductive film for transferring electrons from said first conductive film to said first semiconductor region by tunneling through said first gate insulating film.

9. A method of manufacturing a memory cell according to claim 8, wherein said first gate insulating film is made of a silicon oxide film, said first insulating film is made of a silicon oxide film, said semiconductor substrate is a silicon substrate, and said first semiconductor region has an n-type conductivity.

10. A method of manufacturing a memory cell according to claim 1, wherein said oxidizing step is performed so as to thicken a portion of said first gate insulating film, corresponding to ends of said first conductive film, as compared to a film thickness of another portion of said first gate insulating film.

11. A method of manufacturing a memory cell according to claim 1, wherein said first gate insulating film is made of a silicon oxide film, said first insulating film is made of a silicon oxide film, said semiconductor substrate is a silicon substrate, and said first semiconductor region has an n-type conductivity.

* * * * *